(12) United States Patent
Ahn

(10) Patent No.: US 9,535,522 B2
(45) Date of Patent: Jan. 3, 2017

(54) FLEXIBLE ORGANIC LIGHT EMITTING DIODE DISPLAY DEVICE

(71) Applicant: LG Display Co., Ltd., Seoul (KR)

(72) Inventor: DongSeok Ahn, Seoul (KR)

(73) Assignee: LG Display Co., Ltd., Seoul (KR)

( * ) Notice: Subject to any disclaimer, the term of this patent is extended or adjusted under 35 U.S.C. 154(b) by 29 days.

(21) Appl. No.: 14/579,581

(22) Filed: Dec. 22, 2014

(65) Prior Publication Data

US 2016/0179229 A1  Jun. 23, 2016

(51) Int. Cl.
  *G06F 3/045* (2006.01)
  *G06F 3/041* (2006.01)
  *G09G 3/32* (2016.01)

(52) U.S. Cl.
  CPC .............. *G06F 3/041* (2013.01); *G09G 3/3208* (2013.01); *G06F 2203/04102* (2013.01)

(58) Field of Classification Search
  CPC ...... G06F 3/041; G06F 3/0412; G06F 3/0416; G06F 3/044; G06F 3/045
  USPC ... 345/173–183, 204–215; 178/18.01–18.09, 178/20.01–20.04
  See application file for complete search history.

(56) References Cited

U.S. PATENT DOCUMENTS

| 8,830,195 | B2 * | 9/2014 | Eom | H01L 27/323 345/173 |
| 8,946,690 | B2 * | 2/2015 | Lee | G06F 3/0412 257/40 |
| 9,196,876 | B2 * | 11/2015 | Lee | G06F 3/0412 |
| 2013/0147727 | A1 | 6/2013 | Lee et al. | |
| 2014/0042406 | A1 | 2/2014 | Degner et al. | |
| 2014/0217373 | A1 | 8/2014 | Youn et al. | |
| 2014/0307396 | A1 | 10/2014 | Lee | |
| 2014/0362019 | A1 | 12/2014 | Eom et al. | |

OTHER PUBLICATIONS

PCT International Search Report for PCT/KR2015/011447, Feb. 5, 2016, 4 Pages.

* cited by examiner

*Primary Examiner* — Vijay Shankar
(74) *Attorney, Agent, or Firm* — Fenwick & West LLP

(57) ABSTRACT

There is provided a flexible display having a plurality of innovations configured to allow bending of a portion or portions to reduce apparent border size and/or utilize the side surface of an assembled flexible display.

20 Claims, 22 Drawing Sheets

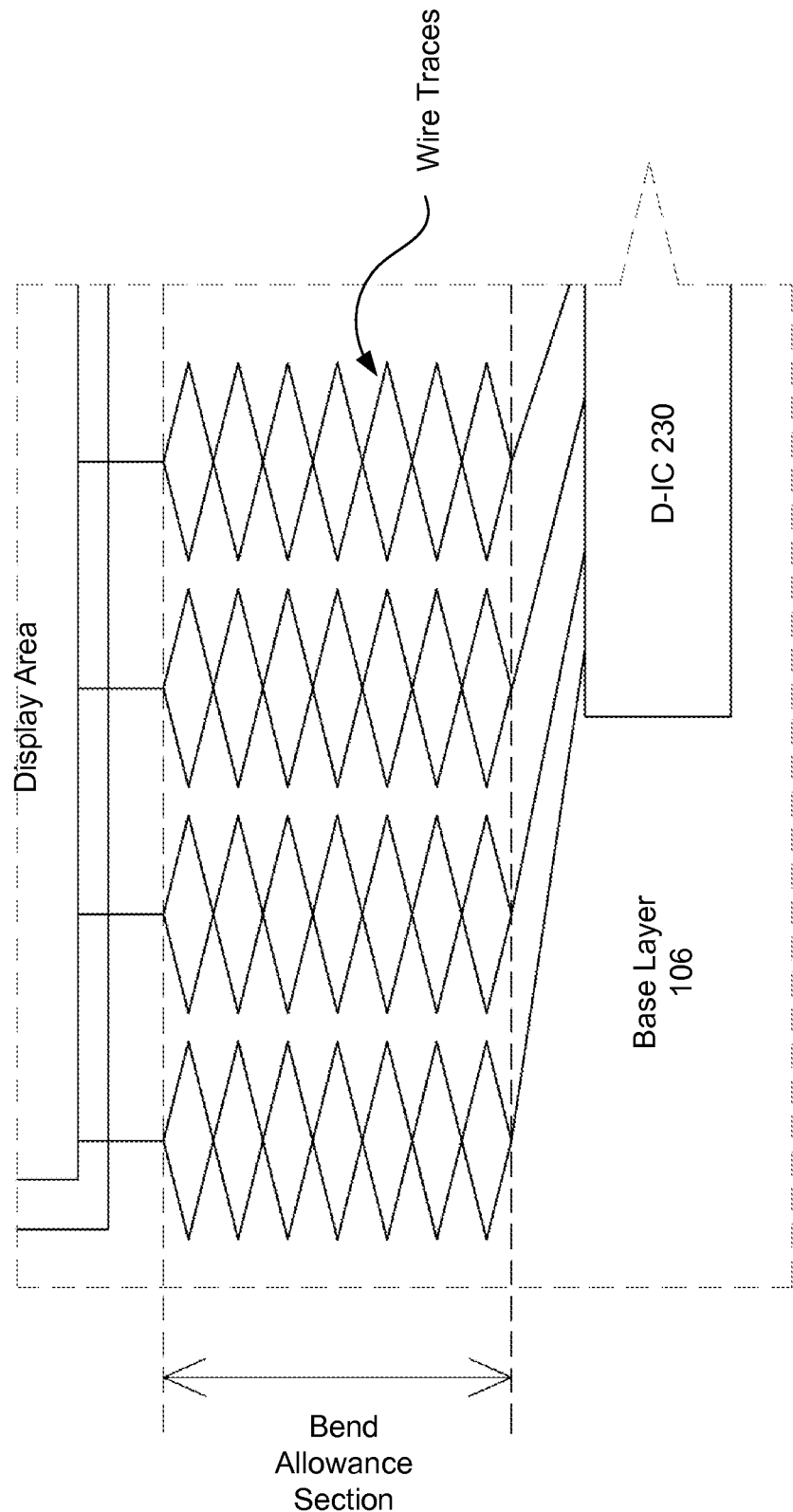

(Wire Trace)

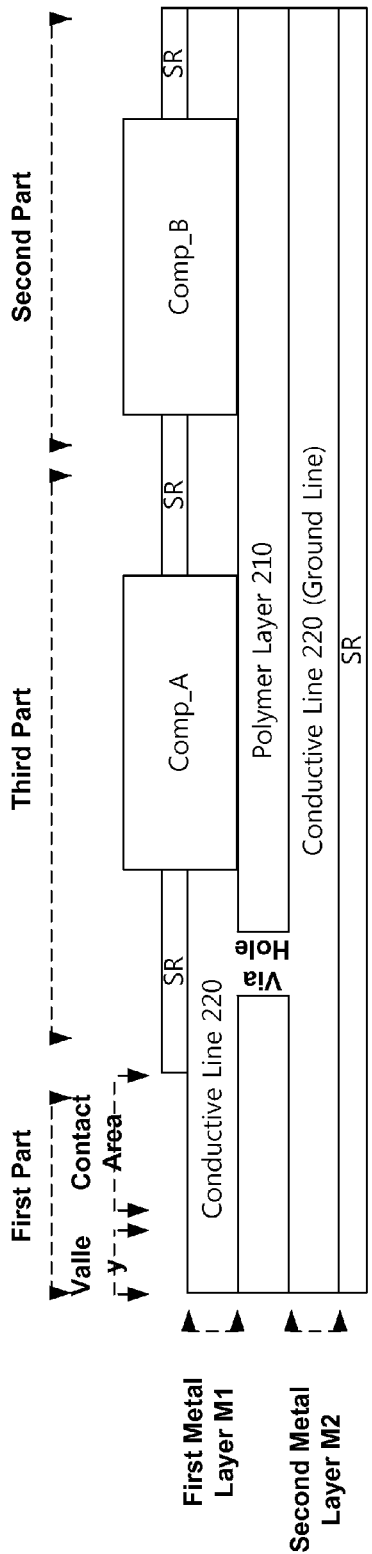
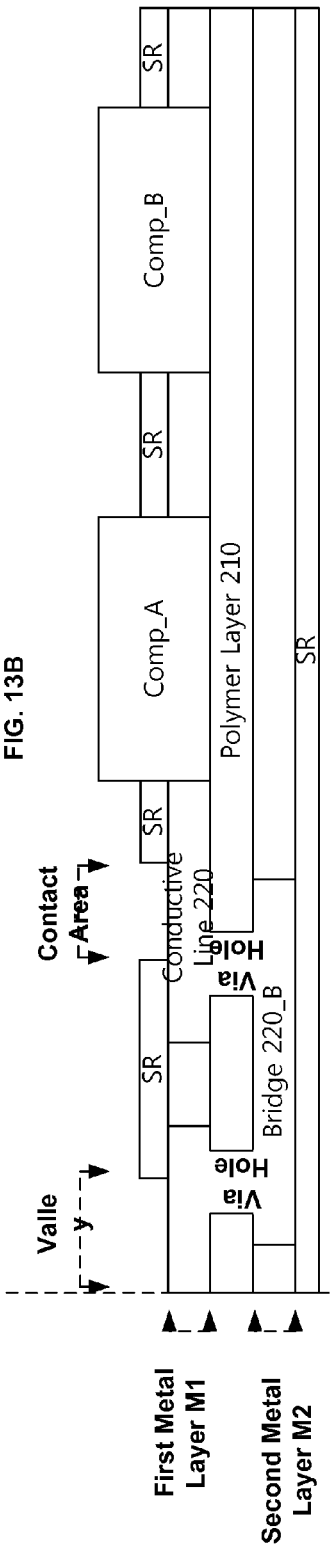
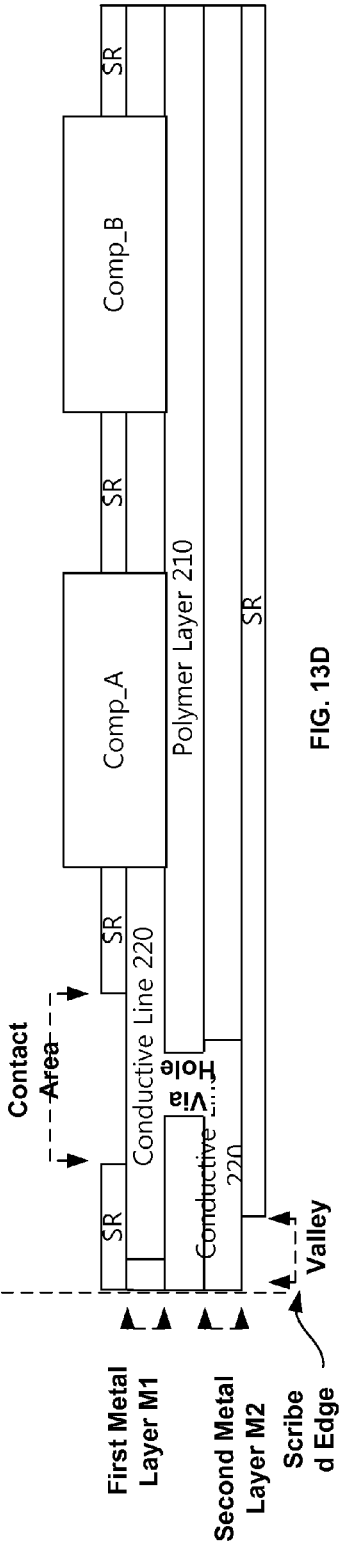
FIG. 13B
FIG. 13C
FIG. 13D

FLEXIBLE ORGANIC LIGHT EMITTING DIODE DISPLAY DEVICE

BACKGROUND

Technical Field

This relates generally to electronic devices, and more particularly, to electronic devices with a display.

Description of the Related Art

Electronic devices often include displays. For example, cellular telephones and portable computers include displays for presenting information to a user. Components for the electronic device, including but not limited to a display, may be mounted in a plastic or a metal housing.

An assembled display may include a display panel and a number of components for providing a variety of functionalities. For instance, one or more display driving circuits for controlling the display panel may be included in a display assembly. Examples of the driving circuits include gate drivers, emission (source) drivers, power (VDD) routing, electrostatic discharge (ESD) circuits, multiplex (mux) circuits, data signal lines, cathode contacts, and other functional elements. There may be a number of peripheral circuits included in the display assembly for providing various kinds of extra functions, such as touch sense or fingerprint identification functionalities. Some of the components may be disposed on the display panel itself, often in the periphery areas next to the display area, which is referred in the present disclosure as the non-display area and/or the non-display area.

Size and weight are of the critical importance in designing modern electronic devices. Also, a high ratio of the display area size compared to that of non-display area, which is sometimes referred to as the screen to bezel ratio, is one of the most desired feature. However, placing some of the aforementioned components in a display assembly may require large non-display area, which may add up to a significant portion of the display panel. Large non-display area tends to make the display panel bulky, making it difficult to incorporate it into the housing of electronic devices. Large non-display area may also necessitate a large masking (e.g., bezel, borders, covering material) to cover a significant portion of the display panel, leading to unappealing device aesthetics.

Some of the components can be placed on a separate flexible printed circuit film and positioned on the rear side of the display panel. Even with such a configuration, however, the interfaces for connecting the flexible printed circuit and the wires between the display area and the connection interface still limit how much reduction in the size of the non-display area can be realized by placing components on a separate FPC.

BRIEF SUMMARY

Accordingly, it is desirable to bend the base substrate where the display area and the non-display area are formed thereon. This would allow even some of the non-display area to be positioned behind the display area of the display panel, thereby reducing or eliminating the non-display area that needs to be hidden under the masking or the device housing. Not only does the bending of the base substrate will minimize the non-display area size need to be hidden from view, but it will also open possibility to various new display device designs.

An aspect of the present disclosure is related to a flexible display provided with printed circuit board. The flexible display includes a flexible base layer defined with a first area, a second area and a bend allowance section between the first area and the second area of the flexible base layer. In the first area of the flexible base layer, an array of thin-film transistors and an array of organic-light emitting diode (OLED) elements disposed. The array of thin-film transistors is configured to control emission of the array of OLED elements. In the second area of the flexible base layer, at least one driver integrated circuit is disposed in the second area of the flexible display. The flexible display further includes a flexible printed circuit board connected to a connection interface provided in the second area of the flexible base layer. In addition to the driver integrated circuit in the second area, a gate driver circuitry, for instance gate-in-panel, is provided in the first area of the flexible base layer.

In some embodiments, the D-IC disposed on the flexible base layer may be a display D-IC. The flexible printed circuit board includes a plurality of conductive lines in the bend allowance section, which are routed from the D-IC in the second area of the flexible base layer to one or more conductive lines placed in the first area of the flexible display.

In some embodiments, at least two conductive lines in the first metal layer of the flexible printed circuit board are bridged by at least one of the conductive lines in the second metal layer of the flexible printed circuit board.

Further features of the invention, its nature and various advantages will be more apparent from the accompanying drawings and the following detailed description of the preferred embodiments.

BRIEF DESCRIPTION OF THE DRAWINGS

FIG. 1B illustrates an enlarged view of a part of the bend allowance section of an exemplary flexible display at according to embodiments of the present disclosure.

FIGS. 13A-13D each illustrates a schematic cross-sectional view of an exemplary printed circuit board, which may be employed in various embodiments of the flexible display.

DETAILED DESCRIPTION

Flexible Display

Figure 1A:
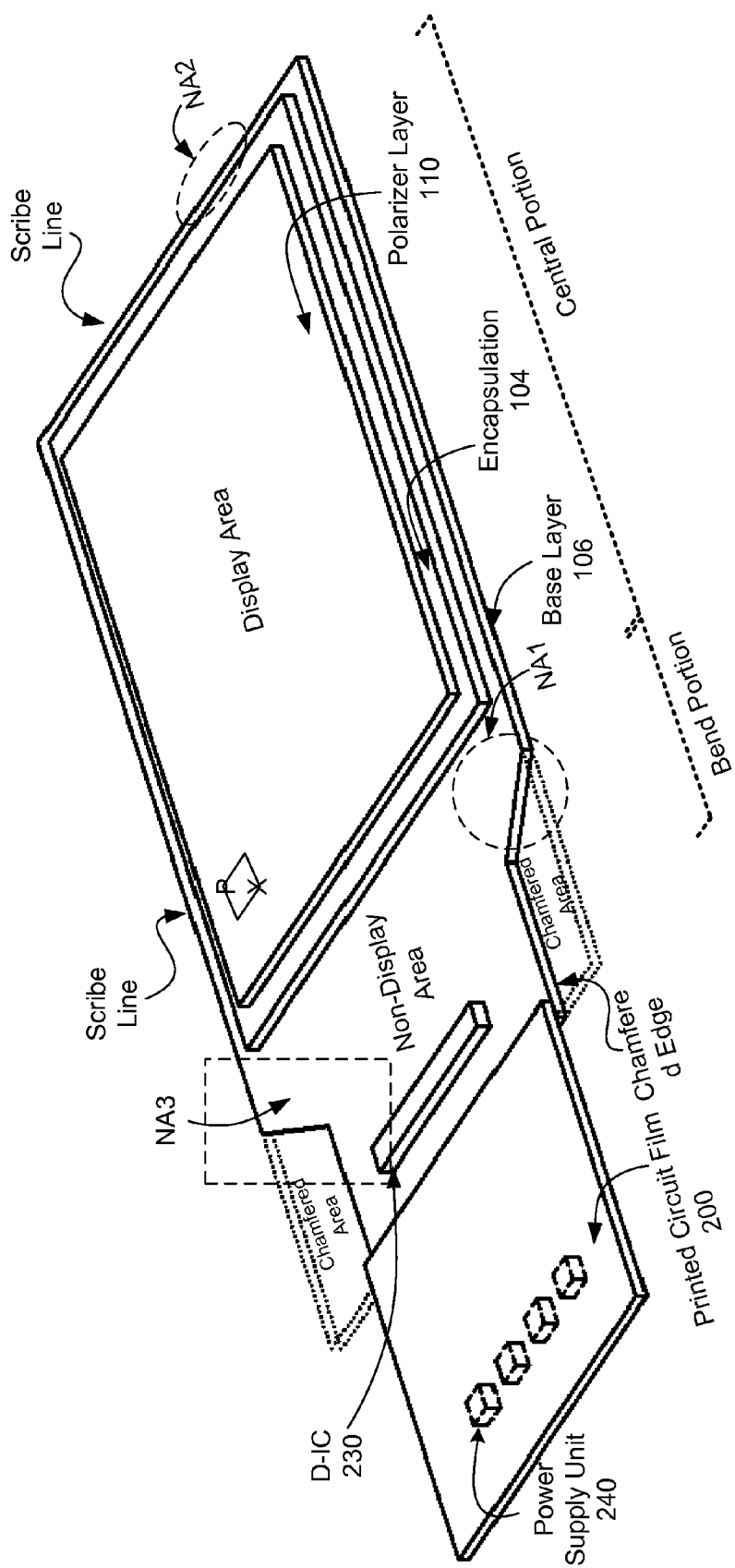
FIG. 1A illustrates a schematic view of an exemplary flexible display according to embodiments of the present disclosure.

FIGS. 1A and 1B illustrate exemplary embodiment of a flexible display which may be incorporated in electronic devices. The flexible display 100 includes at least one display area (i.e., Active Area), in which an array of display pixels are formed therein.

Figure 2:
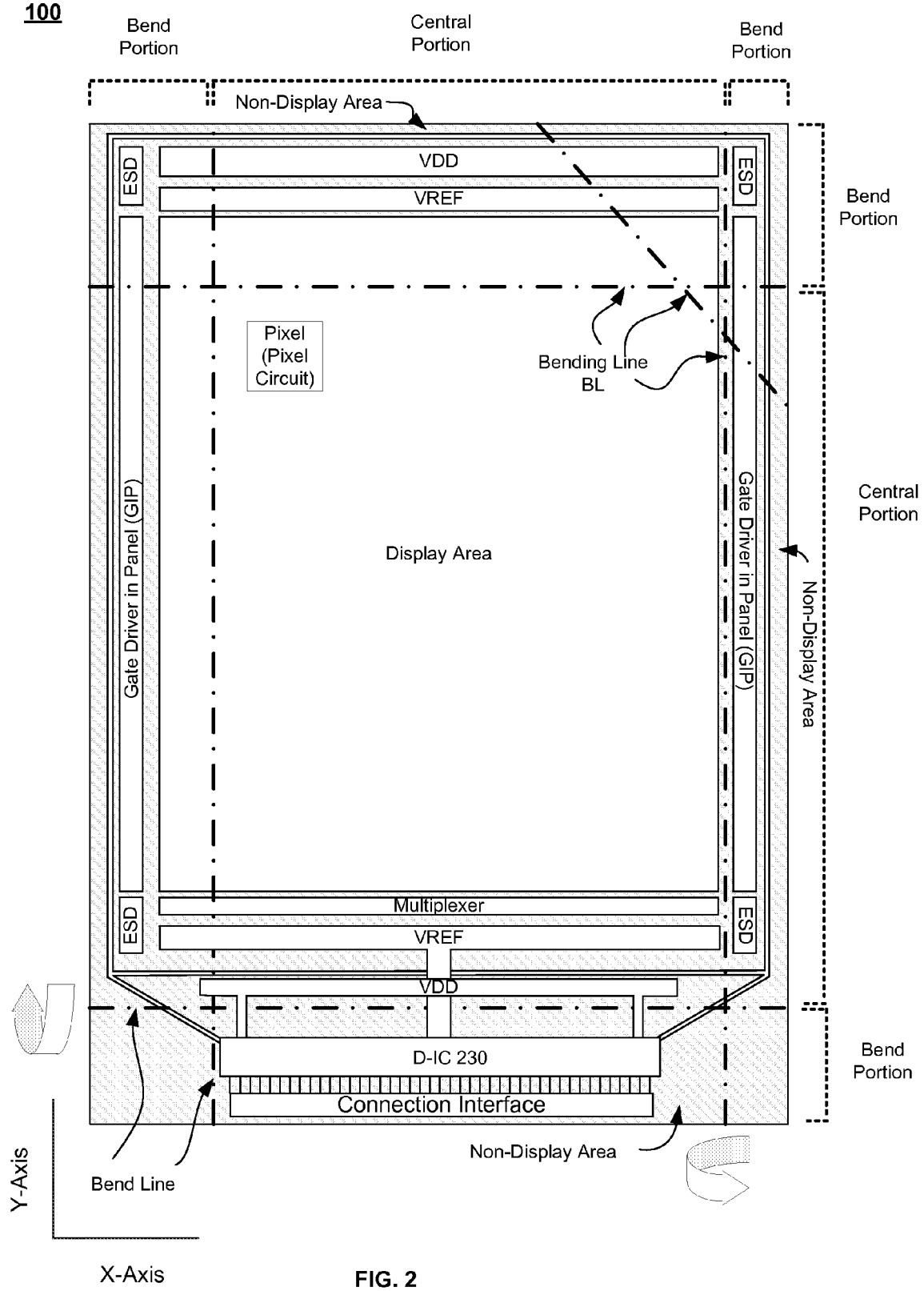
FIG. 2 illustrates a schematic view of an exemplary flexible display according to embodiments of the present disclosure.

One or more non-display areas may be provided at the periphery of the display area. That is, the non-display area may be adjacent to one or more sides of the display area. In FIGS. 1 and 2, the non-display area surrounds a rectangular shape display area. However, it should be appreciated that the shapes of the display area and the arrangement of the non-display area adjacent to the display area are not particularly limited as the exemplary flexible display 100 illustrated in FIGS. 1A and 1B. The display area and the non-display area may be in any shape suitable to the design of the electronic device employing the flexible display 100. Non-limiting examples of the display area shapes in the flexible display 100 include a pentagonal shape, a hexagonal shape, a circular shape, an oval shape, and more.

Each display pixel PX may include a light-emitting element, for instance an organic light-emitting diode (OLED), and pixel circuit. Each display pixel in the display area may be associated with a pixel circuit, which includes at least one switching thin-film transistor (TFT) and at least one driving TFT on the backplane of the flexible display 100. Each pixel circuit may be electrically connected to a gate line and a data line to communicate with one or more driving circuits, such as a gate driver and a data driver positioned in the non-display area of the flexible display 100.

For example, one or more driving circuits may be implemented with TFTs fabricated in the non-display area. Such a driving circuit may be referred to as a gate-in-panel (GIP). The flexible display 100 may include various additional components for generating a variety of signals for operating the pixels in the display area. Non limiting examples of the components for operating the pixels include a display driver integrated circuit (D-IC) 230, an inverter circuit, a multiplexer, an electro static discharge (ESD) circuit, a power supply unit and the like.

The flexible display 100 may also include components associated with functionalities other than for operating the pixels of the flexible display 100. For instance, the flexible display 100 may include components for providing a touch sensing functionality, a user authentication functionality (e.g., finger print scan), a multi-level pressure sensing functionality, a tactile feedback functionality and/or various other functionalities for the electronic device employing the flexible display 100.

Some of the aforementioned components may be mounted directly on the base layer 106. For instance, the driver-IC (D-IC) 230 can be disposed directly on the base layer 106. The COMP_A 230 may be a display driver IC, a touch driver IC, or various other integrated circuit chips that can be placed on a flexible polymer layer. In the flexible display of the present disclosure, an array of pixel circuits and an array of display pixels are formed on a flexible polymer layer (e.g., polyimide layer). Accordingly, any components of the flexible display 100 or any components used by the electronic device employing the flexible display 100, can also be placed directly on the base layer 106 so long as it can be formed on the flexible polymer layer (e.g., PI layer). Components that can go on to the base layer 106 include integrated circuits such as a microprocessor, a microcontroller, an audio chip, an application-specific integrated circuit, or other integrated circuit. Also, discrete electrical components (e.g., resistors, inductors, capacitors, and transistors) may also be mounted directly on the base layer 106.

FIG. 1B is an enlarged view of an exemplary interconnects between the COMP_A 230 on the base layer 106 and the display pixels in the display area. As shown in FIG. 1B, the wire traces applied with a strain-reducing trace pattern laid across the bend allowance section of the flexible display 100 can be connected directly to the COMP_A 230. In this way, spaces for providing connection interfaces to connect another discrete printed circuit can be eliminated from the base layer 106. In addition to the extra area realized from eliminating connection interfaces, placing the components of the flexible display 100 directly on the base layer 106 can simplify the manufacturing processes, as the processes for making connection interfaces on the base layer 106 and bonding the base layer 106 and the separate printed circuit are no longer necessary. Further, the direct connection between the components of the flexible display 100 on the base layer 106 can make the flexible display 100 to be more efficient, may consume less power, may be more reliable, and may enable desirable design features.

Any components of the flexible display 100, which cannot be placed directly on the base layer 106 may be mounted on a separate printed circuit board 200 and coupled to a connection interface (e.g., pads, bumps, pins, etc.) disposed in the non-display.

As will be described in further detail below, the non-display area with the connection interface can be bent away from the plane of the adjacent portion of the flexible display so that the printed circuit board 200 is positioned at the rear side of the flexible display 100.

Multiple parts of the flexible display 100 can be bent along the bend line BL. The bend line BL in the flexible display 100 may be oriented horizontally (e.g., X-axis shown in FIG. 2), vertically (e.g., Y-axis shown in FIG. 2) or even diagonally. Accordingly, the flexible display 100 can be bent in any combination of horizontal, vertical and/or diagonal directions based on the desired design of the flexible display 100.

In some embodiments, one or more edges of the flexible display 100 can be bent away from the plane of the central portion along the bend line BL. In FIG. 2, the bend line BL is depicted as being located near the edges of the flexible display 100. However, it should be noted that the bend lines BL can extend across the central portion or extend diagonally at one or more corners of the flexible display 100. Such configurations would allow the flexible display 100 to provide a display area at an edge of the display device or a foldable display with display pixels provided on both inner/outer sides of in folded configuration.

With the ability to bend one or more portions of the flexible display 100, part of the flexible display 100 may be defined as a substantially flat portion and a bend portion. A part of the flexible display 100 may remain substantially flat and referred to as a substantially flat portion of the flexible display 100. A part of the flexible display 100 may be bent in a certain bend angle from the plane of an adjacent portion, and such portion is referred to as a bend portion of the flexible display 100. The bend portion includes a bend allowance section, which can be actively curved in a certain bend radius.

For easier bending of the base layer 106, the base layer 106 near the bend allowance section may be chamfered. In this case, the width of the base layer 106 at the bend allowance section will be lower than the width of the adjacent areas of the base layer 106. Further, the base layer 106 may be thinner in the bend allowance section than the adjacent areas of the base layer 106.

Depending on the location of the bend line BL in the flexible display 100, a portion on one side of the bend line may be positioned toward the center of the flexible display 100, whereas the portion on the opposite side of the bend line BL is positioned toward an edge portion of the flexible display 100. The portion toward the center may be referred to as the central portion and the portion toward the edge may be referred to as the edge portion of the flexible display 100. Although this may not always be the case, a central portion of the flexible display 100 can be the substantially flat portion and the edge portion can be the bend portion of the flexible display 100. It should be noted that a substantially flat portion can also be provided in the edge portion of the flexible display 100. Further, in some configuration of the flexible display 100, a bend allowance section may be positioned between two substantially flat portions.

It should be understood that the term "substantially flat" includes a portion that may not be perfectly flat. As such, a central portion of the flexible display 100 provided with a slightly concave or convex contour may still be referred as a substantially flat portion in some embodiments discussed in the present disclosure. Even when the "substantially flat" portion has a concave or convex contour, one or more bend portions positioned at the periphery of the convex or concave central portion are bent inwardly or outwardly along the bend line in a bend angle about a bend axis. The bend radius of the bend portion is smaller than the bend radius of the central portion. In short, the term "substantially flat portion" is used in the present disclosure to refer a portion with a lesser curvature than that of an adjacent bend allowance section of the flexible display 100.

The location of the display area is not limited to the central portion or to the substantially flat portion of the flexible display 100. In some embodiments, the bend portion of the flexible display 100 may include a display area capable of displaying image from the bend portion, which is referred herein after as the secondary display area. That is, the bend line BL can be positioned in the display area so that at least some display pixels of the display area is included in the bend portion of the flexible display 100.

Figure 3A:
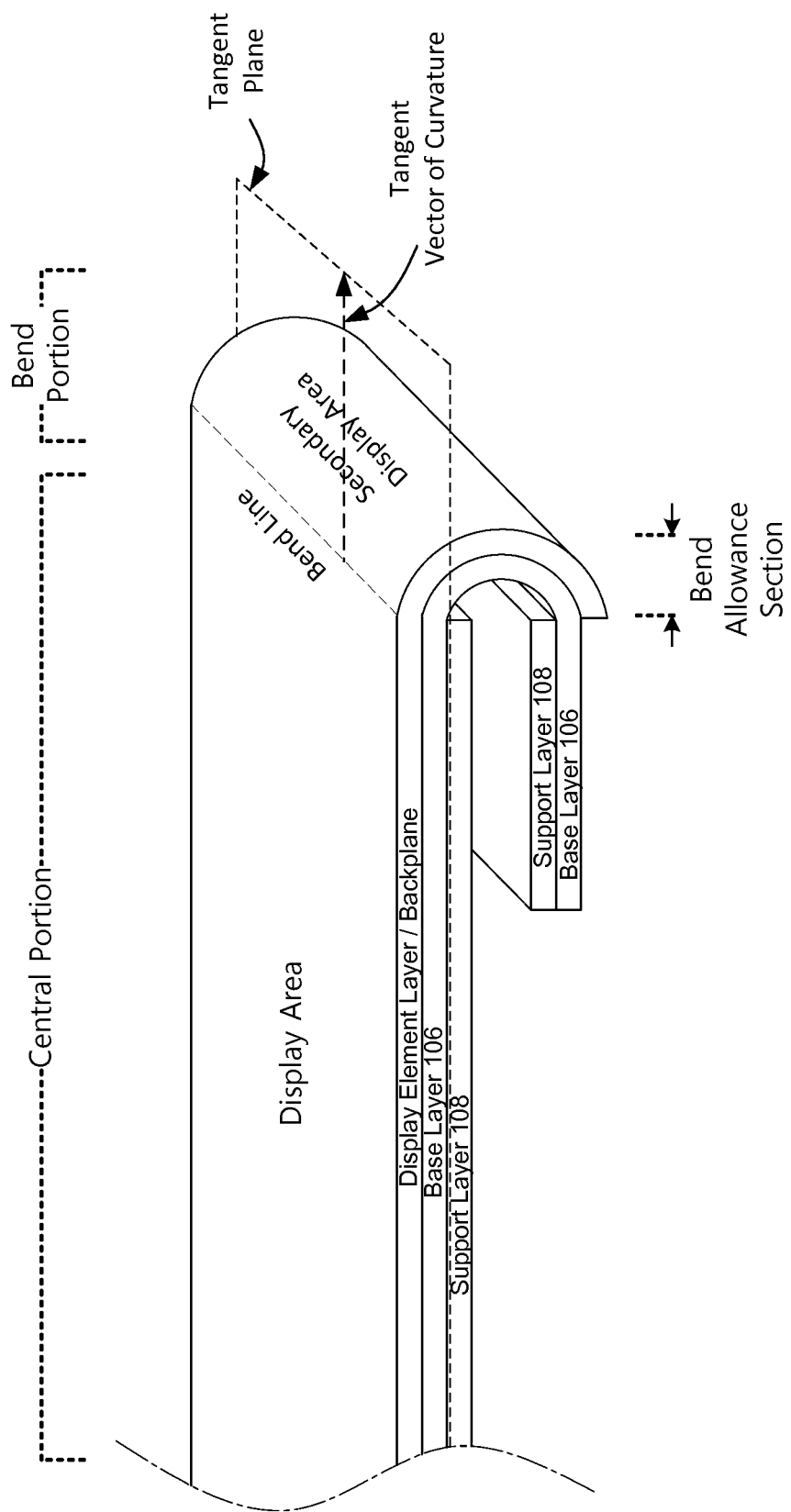
FIGS. 3A and 3B illustrate exemplary arrangement of display areas in a flexible display according to embodiments of the present disclosure.
Figure 3B:
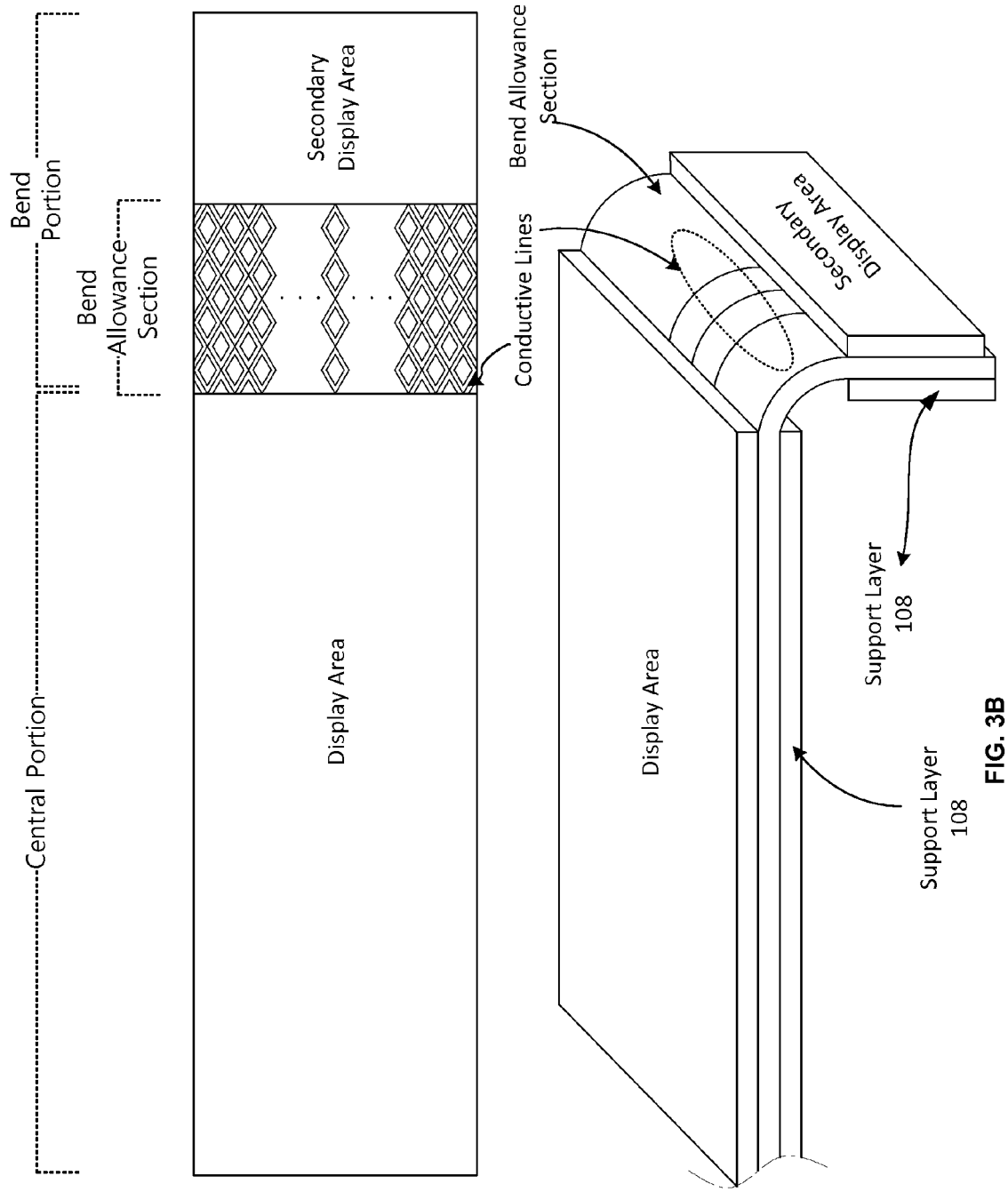

FIGS. 3A and 3B each illustrates an exemplary configuration of display areas in an embodiment of flexible display 100 of the present disclosure. In the configuration depicted in FIG. 3A, the matrix of pixels in the secondary display area of the bend portion may be continuously extended from the matrix of the pixels in the display area of the central portion. Alternatively, in the configuration depicted in FIG. 3B, the secondary display area within the bend portion and the display area within the central portion of the flexible display 100 may be separated apart from each other by a space in the bend allowance section of the flexible display 100. Some components in the central portion and the bend portion can be electrically connected via one or more conductive lines 120 laid across the bend allowance section of the flexible display 100.

The pixels in the secondary display area and the pixels in the central display area may be addressed by the driving circuits (e.g., gate driver, data driver, etc.) as if they are in a single matrix. In this case, the pixels of the central display area and the pixels of the secondary display area may be operated by the same set of driving circuits. By way of example, the $N^{th}$ row pixels of the central display area and the $N^{th}$ row pixels of the secondary display area may be configured to receive the gate/data signals from the same display driver IC. As shown in FIG. 3B, the part of the conductive line crossing over the bend allowance section may have a strain-reducing trace design, which will be described in further detail below.

Depending on the functionality of the secondary display area, the pixels of the secondary display area can be driven discretely from the pixels in the central display area. That is, the pixels of the secondary display area may be recognized by the display driving circuits as being an independent matrix of pixels separate from the matrix of pixels of the central display area. In such cases, the pixels of the secondary display area may receive signals from at least one discrete driving circuit other than a driving circuit for providing signals to the pixels of the central display area.

Regardless of the configuration, the secondary display area in the bend portion may serve as a secondary display area in the flexible display 100. Also, the size of the secondary display area is not particularly limited. The size of the secondary display area may depend on its functionality within the electronic device. For instance, the secondary display area may be used to provide images and/or texts such a graphical user interface, buttons, text messages, and the like. In some cases, the secondary display area may be used to provide light of various colors for various purposes (e.g., status indication light), and thus, the size of the secondary display area need not be as large as the display area in the central portion of the flexible display 100.

Stack-Up Structure

Figure 4:
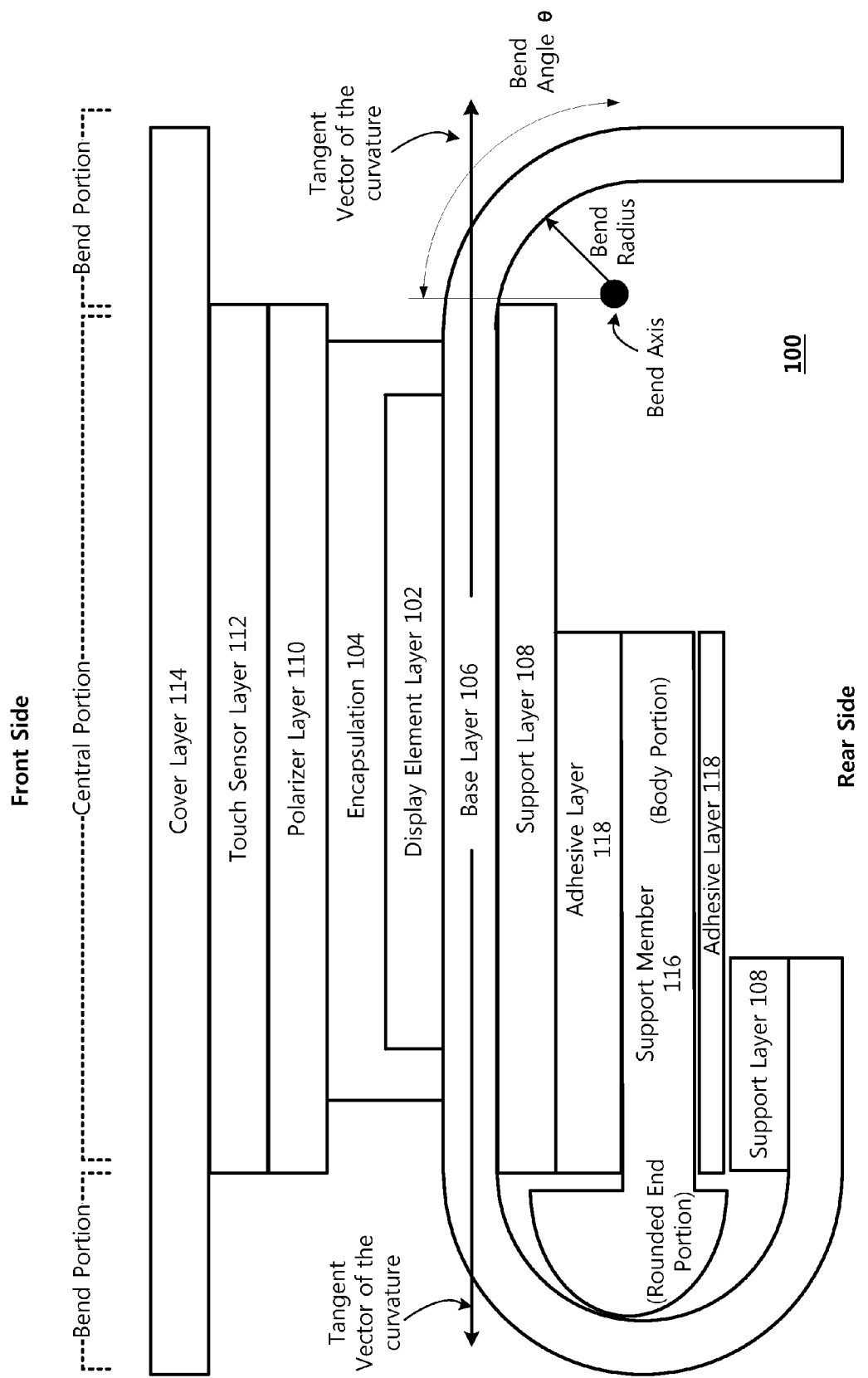
FIG. 4 illustrates simplified stack-up structure of components in an exemplary flexible display apparatus according to embodiment of the present disclosure.

FIG. 4 is a simplified cross-sectional view showing an exemplary stack up structure of a flexible display 100 in an embodiment of the present disclosure. For convenience of explanation, the central portion of the flexible display 100 is illustrated as being substantially flat, and the bend portions are provided at the edges of the flexible display 100 in FIG. 4.

As shown, one or more bend portions may be bent away from the plane of the substantially flat portion in a certain bend angle $\theta$ and with a bend radius R about the bending axis. The size of each bend portion that is bent away from the central portion needs not be the same. That is, the length of the base layer 106 from the bend line BL to the outer edge of the base layer 106 at each bend portion can be different from other bend portions. Also, the bend angle θ around the bend axis and the bend radius R from the bend axis can vary between the bend portions.

In the example shown in FIG. 4, the right side bend portion has the bend angle θ of 90°, and the bend portion includes a substantially flat section. A bend portion can be bent at a larger bend angle θ, such that at least some part of the bend portion comes underneath the plane of the central portion of the flexible display 100 as the bend portion on the left side of the flexible display 100. Also, a bend portion can be bent at a bend angle θ that is less than 90°.

In some embodiments, the radius of curvatures (i.e., bend radius) for the bend portions in the flexible display 100 may be between about 0.1 mm to about 10 mm, more preferably between about 0.1 mm to about 5 mm, more preferably between about 0.1 mm to about 1 mm, more preferably between about 0.1 mm to about 0.5 mm. In some embodiments, the bend radius at a bend portion of the flexible display 100 may be less than 0.5 mm.

One or more support layers 108 may be provided at the underside of the base layer 106 to increase rigidity and/or ruggedness at the selective portion of the flexible display 100. For instance, the support layer 108 can be provided on the inner surface of the base layer 106 at the substantially flat portions of the flexible display 100. The support layer 108 may also be provided in the bend portion. If desired, some part of the base layer 106 requiring more flexibility may not be provided with the support layer 108. For instance, the support layer 108 may not be provided in the bend allowance section of the flexible display 100. In one suitable embodiment, the part of the base layer 106 in the bend portion, which is positioned under the plane of the central portion of the flexible display 100, can be provided with the support layer 108. Increased rigidity and ruggedness at selective parts of the flexible display 100 may help in ensuring accurate configuration and placement of various components during manufacturing and using the flexible display 100.

The base layer 106 and the support layer 108 may each be made of a thin plastic film formed from polyimide, polyethylene naphthalate (PEN), polyethylene terephthalate (PET), other suitable polymers, a combination of these polymers, etc. Other suitable materials that may be used to form the base layer 106 and the support layer 108 include, a thin glass, a metal foil covered with a dielectric material, a multi-layered polymer stack and a polymer composite film comprising a polymer material combined with nanoparticles or micro-particles dispersed therein, etc. Support layers 108 provided in various parts of the flexible display 100 need not be made of the same material. For example, a thin-glass layer may be used as a support layer 108 for the central portion of the flexible display 100 while a thin plastic film layer is used as a support layer 108 for edge portions.

In addition to the constituent material, the thickness of the base layer 106 and the support layer 108 is another factor to consider in designing the flexible display 100. On the one hand, bending of the base layer 106 at a small bend radius can be difficult if the base layer 106 has excessively high thickness. Also, excessive thickness of the base layer 106 can increase mechanical stress to the components disposed thereon during bending the base layer 106. On the other hand, however, the base layer 106 can be too fragile to serve as a substrate for various components of the flexible display if it is too thin.

To meet such requirements, the base layer 106 may have a thickness in a range of about from 5 μm to about 50 μm, more preferably in a range of about 5 μm to about 30 μm, and more preferably in a range of about 5 μm to about 16 μm. The support layer 108 may have a thickness from about 100 μm to about 125 μm, from about 50 μm to about 150 μm, from about 75 μm to 200 μm, less than 150 μm, or more than 100 μm.

In one suitable exemplary configuration, a layer of polyimide with a thickness of about 10 μm to about 16 μm serves as the base layer 106 while a polyethylene terephthalate (PET) layer with a thickness of about 50 μm to about 125 μm serves as the support layer 108. In another suitable exemplary configuration, a layer of polyimide with a thickness of about 10 μm to about 16 μm serves as the base layer 106 while a thin-glass layer with a thickness of about 50 μm to about 200 μm is used as the support layer 108. In yet another suitable exemplary configuration, a thin glass layer is used as the base layer 106 with a layer of polyimide serving as the support layer 108 to suppress breaking of the base layer 106.

During manufacturing, some part of the flexible display 100 may be exposed to external light. Some materials used in fabricating the components on the base layer 106 or the components themselves may undergo undesirable state changes (e.g., threshold voltage shift in the TFTs) due to the light exposure during the manufacturing of the flexible display 100. Some parts of the flexible display 100 may be more heavily exposed to the external light than others, and this can lead to a display non-uniformity (e.g., mura, shadow defects, etc.). To minimize such problems, the base layer 106 and/or the support layer 108 may include one or more materials capable of reducing the amount of external light passing through in some embodiments of the flexible display 100.

The light blocking material, for instance chloride modified carbon black, may be mixed in the constituent material of the base layer 106 (e.g., polyimide or other polymers). In this way, the base layer 106 may formed of polyimide with a shade to provide a light blocking functionality. Such a shaded base layer 106 can also improve the visibility of the image content displayed on the flexible display 100 by reducing the reflection of the external light coming in from the front side of the flexible display 100.

Instead of the base layer 106, the support layer 108 may include a light blocking material to reduce the amount of light coming in from the rear side (i.e., the support layer 108 attached side) of the flexible display 100. The constituent material of the support layer 108 may be mixed with one or more light blocking materials in the similar fashion as described above with the base layer 106. Further, both the base layer 106 and the support layer 108 can include one or more light blocking materials. Here, the light blocking materials used in the base layer 106 and the support layer 108 need not be the same.

Backplane of the flexible display 100, including the array of pixel circuits, is implemented on the base layer 106. Thin-film transistors used in implementing the backplane of the flexible display 100 may use a low-temperature polysilicon (LTPS) semiconductor layer or use an oxide semiconductor layer. In some embodiments, the flexible display 100 may employ multiple kinds of TFTs to implement the driving circuits in the non-display area and/or the pixel circuits in the display area. That is, a combination of an oxide semiconductor TFT and an LTPS TFT may be used to implement the backplane of the flexible display 100. In the backplane, the type of TFTs may be selected according to the operating conditions and/or requirements of the TFTs within the corresponding circuit.

The organic light-emitting diode (OLED) element layer 102 is provided on the base layer 106. The OLED element layer 102 includes a plurality of OLED elements, which is controlled by the pixel circuits and the driving circuits implemented on the base layer 106 as well as any other driving circuits connected to the connection interfaces on the base layer 106. The OLED element of the display pixel may emit light of certain spectral color (e.g., red, green, blue). In some embodiments, the OLED element layer 102 may include OLED elements configured to emit white light.

The encapsulation 104 is provided to protect the OLED element layer 102 from gas and moisture. The encapsulation 104 may include multiple layers of materials for reducing permeation of gas and moisture to protect OLED elements thereunder. In some embodiments, the encapsulation 104 may be provided in a form of a thin film, which is sometimes called as "barrier film layer (BFL)."

The flexible display 100 may also include a polarization layer 110 for controlling the display characteristics (e.g., external light reflection, color accuracy, luminance, etc.) of the flexible display 100. Also, the cover layer 114 may be used to protect the flexible display 100.

Electrodes for sensing touch input from a user may be integrated into the one or the layers provided in the flexible display 100. For instance, the electrodes for sensing touch input from a user may be integrated into the OLED element layer 102. The electrodes for sensing touch input may be formed on an interior surface of a cover layer 114 and/or at least one surface of the polarization layer 110. If desired, an independent layer with the touch sensor electrodes and/or other components associated with sensing of touch input (referred hereinafter as touch-sensor layer 112) may be provided in the flexible display 100. The touch sensor electrodes (e.g., touch driving/sensing electrodes) may be formed from transparent conductive material such as indium tin oxide, carbon based materials like graphene or carbon nanotube, a conductive polymer, a hybrid material made of mixture of various conductive and non-conductive materials. Also, metal mesh (e.g., aluminum mesh, silver mesh, etc.) can also be used as the touch sensor electrodes.

The touch sensor layer 112 may include a layer formed of one or more deformable dielectric materials. One or more electrodes may be interfaced with or positioned near the touch sensor layer 112, and loaded with one or more signals to facilitate measuring electrical changes on one or more of the electrodes upon deformation of the touch sensor layer 112. The measurement may be analyzed to assess the amount of pressure at a plurality of discrete levels and/or ranges of levels on the flexible display 100.

In some embodiments, the touch sensor electrodes can be utilized in identifying the location of the user inputs as well as assessing the pressure of the user input. Identifying the location of touch input and measuring of the pressure of the touch input on the flexible display 100 may be achieved by measuring changes in capacitance from the touch sensor electrodes on one side of the touch sensor layer 112. The touch sensor electrodes and/or other electrode may be used to measure a signal indicative of the pressure on the flexible display 100 by the touch input. Such a signal may be obtained simultaneously with the touch signal from the touch sensor electrodes or obtained at a different timing.

As mentioned above, bending the non-display area allows to minimize or to eliminate the non-display area to be seen from the front side of the assembled flexible display 100. Part of the non-display area that remains visible from the front side can be covered with a bezel. The bezel may be formed, for example, from a stand-alone bezel structure that is mounted to the cover layer 114, a housing or other suitable components of the flexible display 100. The non-display area remaining visible from the front side may also be hidden under an opaque masking layer, such as black ink (e.g., a polymer filled with carbon black) or a layer of opaque metal. Such an opaque masking layer may be provided on a portion of various layers included in the flexible display 100, such as a touch sensor layer 112, a polarization layer 110, a cover layer 114, and other suitable layers included in the flexible display 100.

Components of the flexible display 100 may make it difficult to bend the flexible display 100 along the bend line BL. Some of the elements, such as the support layer 108, the touch sensor layer 112, the polarization layer 110 and the like, may add too much rigidity to the flexible display 100. Also, the thickness of such elements shifts the neutral plane of the flexible display 100 and thus some of the components may be subject to greater bend stresses than other components.

To facilitate easier bending and to enhance the reliability of the flexible display 100, the configuration of components in the bend portion of the flexible display 100 differs from the substantially flat portion of the flexible display 100. Some of the components existing in the substantially flat portion may not be disposed in the bend portions of the flexible display 100, or may be provided in a different thickness. The bend portion may free of the support layer 108, the polarization layer 110, the touch sensor layer 112, a color filter layer (not shown) and/or other components that may hinder bending of the flexible display 100. Such components may not be needed in the bend portion if the bend portion is to be hidden from the view or otherwise inaccessible to the users of the flexible display 100.

Even if the secondary display area is in the bend portion for providing information to users, the secondary display area may not require some of these components depending on the usage and/or the type of information provided by the secondary display area. For example, the polarization layer 110 and/or color filter layer may not be needed in the bend portion when the secondary display area is used for simply emitting colored light, displaying texts or simple graphical user interfaces in a contrast color combination (e.g., black colored texts or icons in white background). Also, the bend portion of the flexible display 100 may be free of the touch sensor layer 114 if such functionality is not needed in the bend portion. If desired, the bend portion may be provided with a touch sensor layer 112 and/or the layer of electro-active material even though the secondary display area for displaying information is not provided in the bend portion.

Since the bend allowance section is most heavily affected by the bend stress, various bend stress-reducing features are applied to the components on the base layer 106 of the bend allowance section. To this end, some of the elements in the central portion may be absent in at least some part of the bend portion. The separation between the components in the central portion and the bend portion may be created by selectively removing the elements at the bend allowance section of the flexible display 100 such that the bend allowance section is free of the respective elements.

As depicted in FIG. 4, the support layer 108 in the central portion and the support layer 108 in the bend portion can be separated from each other by the absence of the support layer 108 at the bend allowance section. Instead of using the support layer 108 attached to the base layer 106, a support member 116 with a rounded end portion can be positioned underside of the base layer 106 at the bend allowance section. Various other components, for example the polarization layer 110 and the touch sensor layer 112 and more, may also be absent from the bend allowance section of the flexible display 100. The removal of the elements may be done by cutting, wet etching, dry etching, scribing and breaking, or other suitable material removal methods. Rather than cutting or otherwise removing an element, separate pieces of the element may be formed at the selective portions (e.g., substantially flat portion and the bend portion) to keep the bend allowance section free of such element.

As mentioned, the support layer 108 may not be present at the bend allowance section to facilitate easier bending of the base layer 106. Absent the support layer 108, however, the curvature at the bend allowance section may be easily altered by external force. To support the base layer 106 and maintain the minimum curvature at the bend allowance section, the flexible display 100 may also include a support member 116, which may also be referred to as a "mandrel." The exemplary support member 116 depicted in FIG. 4 has an elongated body portion and a rounded end portion. The base layer 106 and the support member 116 are arranged so that that the rounded end portion of the support member 116 is positioned at the underside of the base layer 106 corresponding to the bend allowance section of the flexible display 100.

In embodiments where a bend portion is provided at an edge of the flexible display 100, the support member 116 can be provided at the edge of the flexible display 100. In this setting, a part of the base layer 106 may come around the rounded end portion of the support member 116 and be positioned at the underside the support member 116 as depicted in FIG. 4. Various circuits and components in the non-display area of the flexible display 100, such as driving circuits and interfaces for connecting printed circuit boards (PCB) may be provided on the base layer 106 that is positioned at the rear side of the flexible display 100. In this way, even the components that are not flexible enough to be bent in a bend radius desired by the flexible display 100 can be placed under the display area of the flexible display 100.

The support member 116 can be formed of plastic material such as polycarbonate (PC), polyimide (PI), polyethylene naphthalate (PEN), polyethylene terephthalate (PET), other suitable polymers, a combination of these polymers, etc. The rigidity of the support member 116 formed of such plastic materials may be controlled by the thickness of the support member 116 and/or by providing additives for increasing the rigidity. The support member 116 can be formed in a desired color (e.g., black, white, etc.). Further, the support member 116 may also be formed of glass, ceramic, metal or other rigid materials or combinations of aforementioned materials.

Size and shape of the rounded end portion of the support member 116 can vary depending on the minimum curvature desired at the bend allowance section of the flexible display 100. In some embodiments, the thickness of the rounded end portion and the thickness of the elongated body portion may be substantially the same. In other embodiments, the elongated body portion, which has a planar shape, may be thinner than the rounded end portion of the support member 116. With a thinner profile at the elongated body portion, the support member 116 can support the bend allowance section while avoiding unnecessary increase in the thickness in the flexible display 100.

Since the support at the bend allowance section is provided by the rounded end portion of the support member 116, the elongated body portion in the substantially flat portion of the flexible display 100 needs not be extended into the display area. While the elongated body portion can be extended under the display area for various reasons, the length of the elongated body portion from the rounded end portion towards the opposite end is sufficient so long as it provides enough surface area for securing the support member 116 in a desired location of the flexible display 100.

To secure the support member 116 in the flexible display 100, an adhesive layer 118 may be provided on the surface of the support member 116. The adhesive layer 118 may include a pressure-sensitive adhesive, a foam-type adhesive, a liquid adhesive, a light-cured adhesive or any other suitable adhesive material. In some embodiments, the adhesive layer 118 can be formed of, or otherwise includes, a compressible material and serve as a cushion for the parts bonded by the adhesive layer 118. As an example, the constituent material of the adhesive layer 118 may be compressible. The adhesive layer 118 may be formed of multiple layers, which includes a cushion layer (e.g., polyolefin foam) interposed between an upper and a lower layers of an adhesive material.

The adhesive layer 118 can be placed on at least one of the upper surface and the lower surface of the elongated body portion of the support member 116. When the bend portion of the flexible display 100 wraps around the rounded end portion of the support layer 116, an adhesive layer 118 can be provided on both the lower surface (i.e., the surface facing the rear side) and the upper surface (i.e., the surface facing the front side) of the elongated body portion. If desired, an adhesive layer 118 may be provided between the surface of the rounded end portion of the support member 116 and the inner surface of the base layer 106.

During bending, a part of the flexible display 100 on one side of the support member 116 may be pulled toward the support member 116, and the base layer 106 may be damaged by the highest and the lowest edges of the rounded end portion. As such, the height of the adhesive layer 118 and the support layer 108 between the support member 116 and the base layer 106 may be at least equal to or greater than the vertical distance between the highest edge of the rounded end portion and the surface of the elongate body portion where the adhesive layer 118 is placed. In other words, the height of the space created by the thickness difference between the rounded end portion and the elongated body portion of the support member 116 may be equal to or less than the collective thickness of the support layer 108 and the adhesive layer 118.

Depending on the shape of the support member 116, a thickness of the adhesive layer 118 on the upper and the lower surfaces of the elongated body portion may be different. For instance, the elongated body portion, which is thinner than the rounded end portion, may not be at the center of the rounded end portion of the support member 116. In such cases, the space on one side of the support member 116 may be greater than the space on the opposite side.

In another example, the lowest edge of the rounded end portion may be in-line with the bottom surface of the elongated body portion such that the space is provided only on one side of the elongated body portion. In such cases, the adhesive layer 118 on one side of the elongated body portion of the support member 116 can be thicker than the one on the opposite side. It should be appreciated that the dimensions of the support member 116 in FIG. 4 may be exaggerated for the purposes of simpler explanation.

Figure 5A:
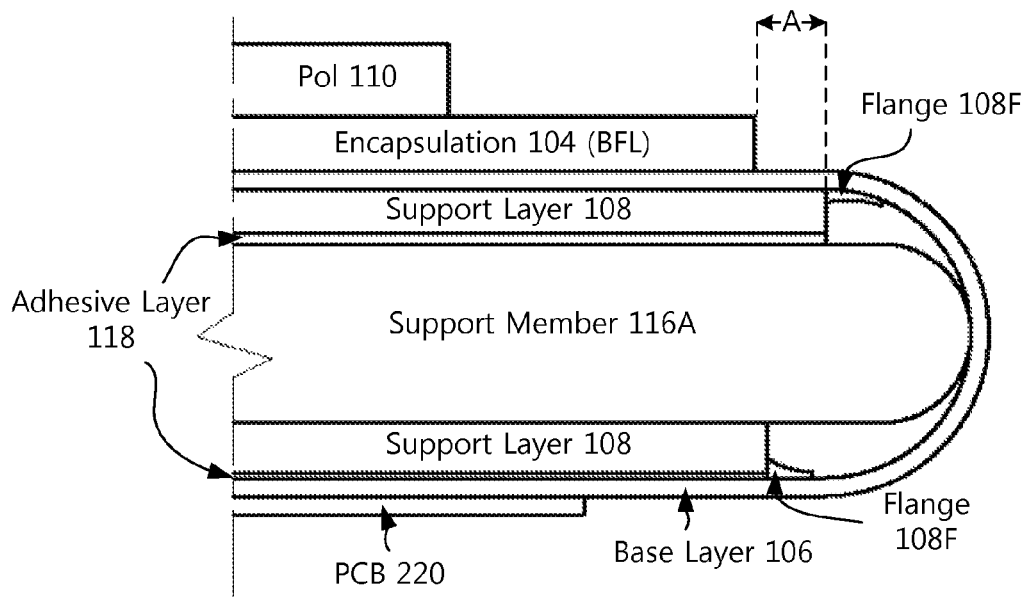
FIGS. 5A-5D are cross-sectional views of illustrative arrangement of components in a flexible display apparatus according to various embodiments of the present disclosure.

FIGS. 5A, 5B, 5C and 5D are simplified cross-sectional views showing exemplary arrangements of elements in various embodiments of the flexible display 100. In one suitable configuration, which is depicted in FIG. 5A, the thickness of the rounded end portion and the elongated body portion of the support member 116A may be substantially the same as illustrated in FIG. 5A. Such a support member 116A can be formed of the plastic materials mentioned above. The support member 116A may also be formed of a folded thin sheet metal (e.g., SUS). In this case, the folded edge of the sheet metal can serve as the rounded end portion of the support member 116A. Even when a sheet metal is used to form the support member, the rounded end portion can have greater thickness than the elongated body portion. For instance, pressure can be applied on the part of the folded metal sheet for the elongated body portion to make that portion thinner than the folded edge.

An adhesive layer 118A may be applied on the upper, the lower surface and the surface of the rounded end portion of the support member 116A. As the thickness of the support member 116A at the rounded end portion and the elongated body portion is about the same, the thickness of the adhesive layer 118A may have a substantially uniform thickness on the surface of the support member 116A. However, it should be noted that the adhesive layer 118A can be thinner and/or thicker at selective parts of the support member 116A.

Figure 5B:
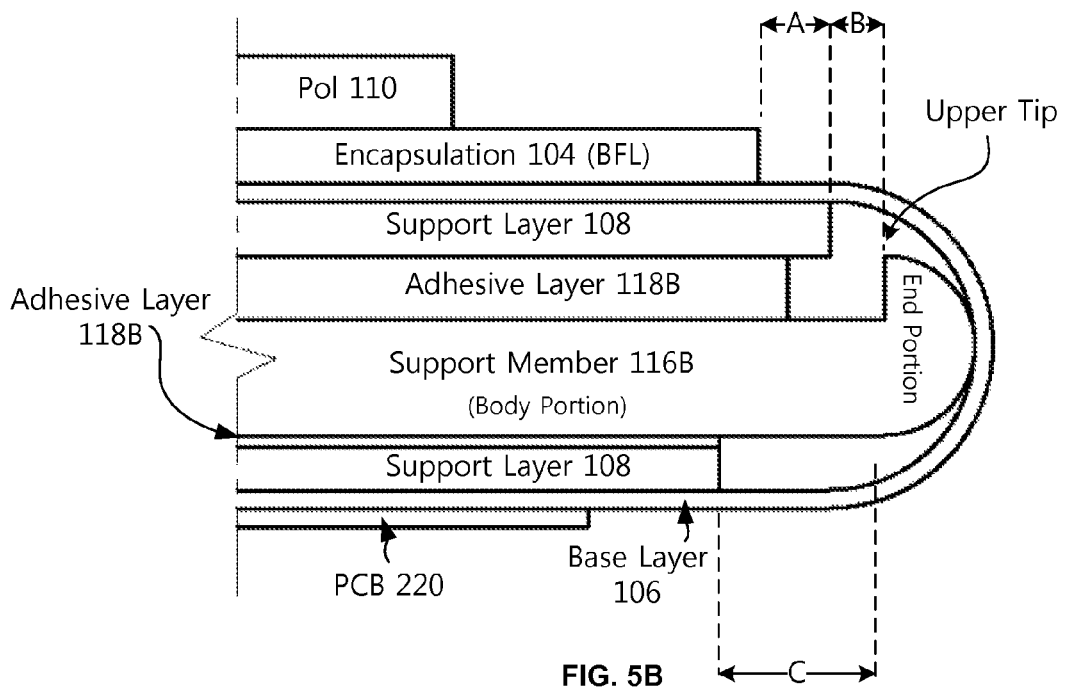

In another suitable configuration, which is depicted in FIG. 5B, the elongated body portion of the support member 116 is thinner than its rounded end portion. In this regard, the bottom surface of the elongated body portion is in-line with the lowest edge of the rounded end portion, providing a support member 116B with a flat bottom. In this exemplary configuration, the support members 116B may be formed of one or a combination of aforementioned plastic materials (e.g., polycarbonate). Also, the adhesive layer 118B provided on the upper surface of the elongated body portion is thicker than the adhesive layer 118B provided on the bottom surface of the elongated body portion of the support member 116B. The adhesive layer 118B on the upper surface of the elongated body portion may include a cushion layer described above while the adhesive layer 118B on the lower surface does not.

Figure 5C:
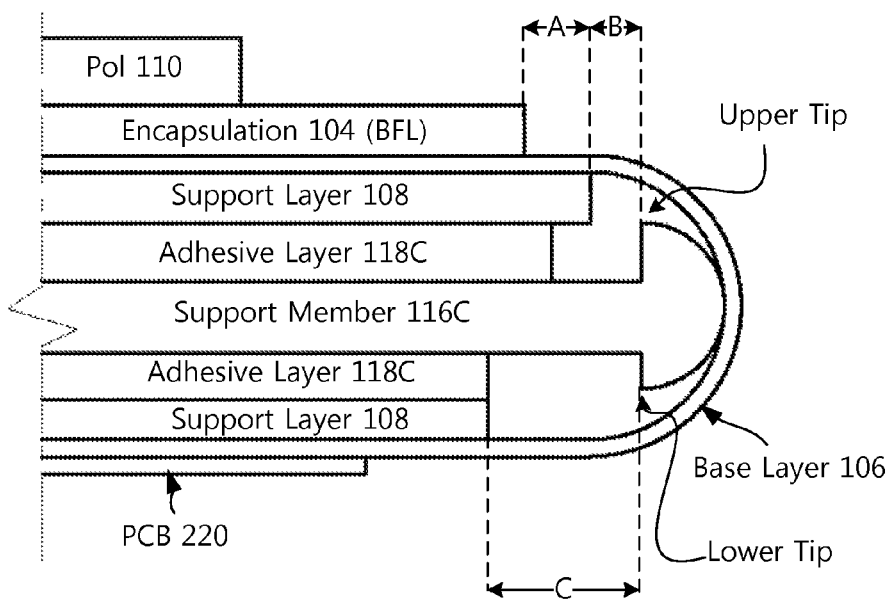

In yet another suitable configuration shown in FIG. 5C, neither the top nor the bottom surfaces of the elongated body portion of the support member 116C is in-line with the highest/lowest edges of the rounded portion. The support members 116C may be formed of one or a combination of aforementioned plastic materials (e.g., polycarbonate). In this example, the elongated body portion may be off-centered (i.e., closer to the lowest edge of the rounded portion), and the adhesive layer 118C on the upper surface of the elongated body portion is thicker than the adhesive layer 118C on the lower surface. The adhesive layer 118C on the upper surface of the elongated body portion may include a cushion layer described above while the adhesive layer 118C on the lower surface does not.

In the exemplary configurations depicted in FIGS. 5A-5C, the support layer 108 on the upper side of the support member 116 is extended out toward the bend allowance section further than the encapsulation 104. In other words, some of the support layer 108 near the edge of the flexible display 100 is not overlapped by the encapsulation 104. The extra margin (denoted "A") of the support layer 108 provided under the encapsulation 104 can help maintain a steady rate of curvature in the bend allowance section.

When bending the base layer 106 around the rounded end portion of the support member 116, the support layer 108 can be positioned on the rounded end portion of the support member 116 due to alignment error. In such cases, the support layer 108 on the rounded end portion may push away the elements on the base layer 106 and shift the neutral plane or cause delamination of those elements in the bend portion of the flexible display 100. As such, the support layer 108 under the base layer 106 is arranged such that the edge of the support layer 108 is extended out toward the bend allowance section further than the edge of the encapsulation 104. In other words, the support member 116 may be placed under the support layer 108 with some margin (denoted "B") between the edge of the support layer 108 and the tip of the support member 116.

Similar to the support layer 108 place above the support member 116, the support layer 108 under the support member 116 should not be placed on the rounded end portion of the support member 116. However, the edge of the support layer 108 under the support member 116 needs not be aligned with the edge of the support layer 108 above the support member 116. Considering that the base layer 106 will be wrapped around the rounded end portion of the support member 116, spacing between the separated support layers 108 on the bottom surface of the base layer 106 can be set with some alignment error margin. As such, the support layer 108 to be placed under the support member 116 may be arranged on the bottom surface of the base layer 106 such that the edge of the lower side support layer 108 is positioned further away from bend allowance section than the edge of the support layer 108 above the support member 116. In this setting, the distance between the edge of the lower side support layer 108 and the lower tip of the rounded end portion of the support member 116 (denoted "C") can be greater than the distance between the edge of the upper side support layer 108 and the upper tip of the rounded end portion of the support member 116 (denoted "C").

In some embodiments, the edge of the support layer 108 toward the bend allowance section can be provided with a flange 108F, which extends even further out toward the bend allowance section as shown in FIG. 5A. The flange may be formed by cutting or otherwise patterning the support layer 108 to have a tapered edge. The flange can also be provided by stacking at least two support layers with their edges shifted from each other. While omitted in FIGS. 5B and 5C, the flange can be provided in those embodiments as well.

It should be appreciated that the configurations described above in reference to FIGS. 5A-5C are merely illustrative. Adhesive layers 118 having the same thickness can be provided on the upper and the lower surfaces of the support member regardless of the position of the elongated body portion. Further, adhesive layers 118 on both the upper surface and the lower surface of the support member 116 can include a cushion layer.

Figure 5D:
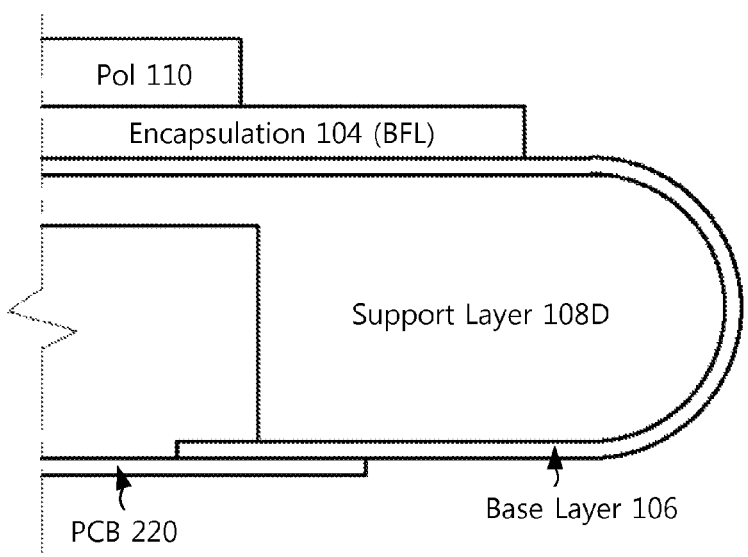

Instead of employing a discrete support member 116, in some embodiments of the flexible display 100, the support layer 108 may be provided with a thickened rounded end positioned under the base layer 106 in the bend allowance section. FIG. 5D is a schematic illustration showing an exemplary arrangement of the support layer 108 under the base layer 106 at the bend portion of the flexible display 100. In this example, the end portion of the support layer 108 is thicker than the portion of the support layer 108 under the display area of the flexible display 100. Also, the thicker portion of the support layer 108 has a rounded edge, which substantially conforms to the curvature of the base layer 106 in the bend allowance section. In this way, the rounded edge of the support layer 108 can serve as the support member 116 employed in the embodiments depicted in FIGS. 5A-5C.

As such, a portion of the support layer 108D corresponding to the substantially flat portion of the flexible display 100 or to the display area can have a different thickness from the portion of the support layer 108D corresponding to the bend portion of the flexible display 100. It should be noted that the thickness of the support layer 108D may be thicker in the bend portion of the flexible display 100 than the substantially flat portion of the flexible display 100 as the rounded edge portion of the support layer 108D is used in providing the curved surface for the flexible base layer 106 to be wrapped around. Similar to the support member 116 of the previously mentioned embodiments, the support layer 108D provided with the rounded edge portion can be formed in a desired color (e.g., black, white, etc.).

Unlike the embodiments employing two separate support layers 108 (e.g., 108A, 108B) at the opposite ends of the bend allowance section, a single piece of support layer 108D is used to support the base layer 106 in the bend portion of the flexible display 100. In addition to the cost savings and process simplification in manufacturing of the flexible display 100, the elimination of a separate support member 116 from the flexible display 100 provides may provide various benefits as to the design of the flexible display 100. First of all, it is very unlikely that the encapsulation 104 will be extended out toward the bend allowance section past the support layer 108D when using the end of the support layer 108D to support the base layer 106 in the bend allowance section. Accordingly, any problems which might result from the misalignment of the encapsulation 104 in relation to the edge of the support layer 108 on the separate support member 116 can be prevented.

Also, using a single piece of support layer 108D for supporting the base layer 106 in the bend portion eliminates the needs for providing alignment error margins between separate pieces of the elements in the bend allowance section. For instance, the extra margins for ensuring that the support layers are not placed over the rounded end portion of the support member 116 (e.g., margins B and C) are no longer needed. With the extra margin reduced or eliminated from the design of the bend portion, even a narrower bezel can be achieved in the flexible display 100.

The support layer 108D may be formed of any of the plastic materials described suitable for the support layer 108 and the support member 116. For example, the support layer 108D can be formed of plastic material such as polycarbonate (PC), polyimide (PI), polyethylene naphthalate (PEN), polyethylene terephthalate (PET), other suitable polymers, a combination of these polymers, etc. The rigidity of the support layer 108D formed of such plastic materials may be controlled by the thickness of the support layer 108D and/or by providing additives for increasing the rigidity. However, to provide the thicker rounded end portion in the support layer 108D as shown in FIG. 5D, it is preferred that the support layer 108D is formed of a material suitable for an injection molding process or other processes capable of forming the support layer 108D with an edge that is sufficiently rounded to accommodate the curvature of the base layer 106 in the bend allowance section.

Conductive Lines

Several conductive lines are included in the flexible display 100 for electrical interconnections between various components therein. The circuits fabricated in the display area and non-display area may transmit various signals via one or more conductive lines to provide a number of functionalities in the flexible display 100. As briefly discussed, some conductive lines may be used to provide interconnections between the circuits and/or other components in the central portion and the bend portion of the flexible display 100.

As used herein, the term conductive lines broadly refers to a trace of conductive path for transmitting any type of electrical signals, power and/or voltages from one point to another point in the flexible display 100. As such, conductive lines may include source/drain electrodes of the TFTs as well as the gate lines/data lines used in transmitting signals from some of the display driving circuits (e.g., gate driver, data driver) in the non-display area to the pixel circuits in the display area. Likewise, some conductive lines, such as the touch sensor electrodes, pressure sensor electrodes and/or fingerprint sensor electrodes may provide signals for sensing touch input or recognizing fingerprints on the flexible display 100. Furthermore, conductive lines can provide interconnections between elements of the display area in the central portion and elements of the secondary display area in the bend portion of the flexible display 100. It should be appreciated that the functionalities of conductive lines described above are merely illustrative.

Conductive lines in a flexible display 100 should be carefully designed to meet various electrical and non-electrical requirements. For instance, a conductive line may have a specific minimum electrical resistance level, which may vary depending on the type of signals to be transmitted via the conductive line. Some conductive lines may be routed from the substantially flat portion to the bend portion of the flexible display 100. Such conductive lines should exhibit sufficient flexibility to maintain its mechanical and electrical robustness. To this end, some conductive lines of the flexible display 100 may have a multi-layered structure.

Accordingly, in some embodiments, at least some of the conductive lines 120 of the flexible display 100 may be formed with two or more of layers selected from aluminum (Al), titanium (Ti), molybdenum (Mo), Copper (Cu) layers. Examples of such combination include an aluminum layer sandwiched between titanium layers (Ti/Al/Ti), an aluminum layer sandwiched between upper and lower molybdenum layers (Mo/Al/Mo), a copper layer sandwiched between titanium layers (Ti/Cu/Ti) and a copper layer sandwiched between upper and lower molybdenum layers (Mo/Cu/Mo). Of course, other conductive materials can be used for the primary/secondary conductive layers.

Manufacturing of the flexible display 100 can involve scribing a large flexible polymer sheet into a base layer 106 of a desired shape and size. Also, some parts of the base layer 106 may become unnecessary as the manufacturing progresses, and such parts can be chamfered away from the base layer 106. Some conductive lines on the base layer 106 laid across the scribing line and/or the chamfering line can be cut during the scribing and/or chamfering processes. For instance, one or more conductive lines used for testing or temporarily operating the driving circuits, pixels and/or various other components during manufacturing of the flexible display 100 may be laid across the scribe line or the chamfering line of the base layer 106. Such conductive lines may be referred to as the "test lines" in the present disclosure. Once the tests or other procedures involving the use of these test lines are completed, scribing and/or chamfering processes can be performed to remove the scribed/chamfered area along with the parts of the test lines placed thereon.

In some embodiments, a pad for receiving one or more signals may be provided on one end of the conductive lines. The other end of the conductive line may be connected to the data lines of the pixels and/or some of the driving circuits. Various signals can be supplied on the conductive line via the pads and transmitted to the destination via the conductive line to carry out the test procedures. These test pads may take a considerable space on the base layer 106, and thus they can be placed on the part of the base layer 106 to be scribed/chamfered away.

Figure 6A:
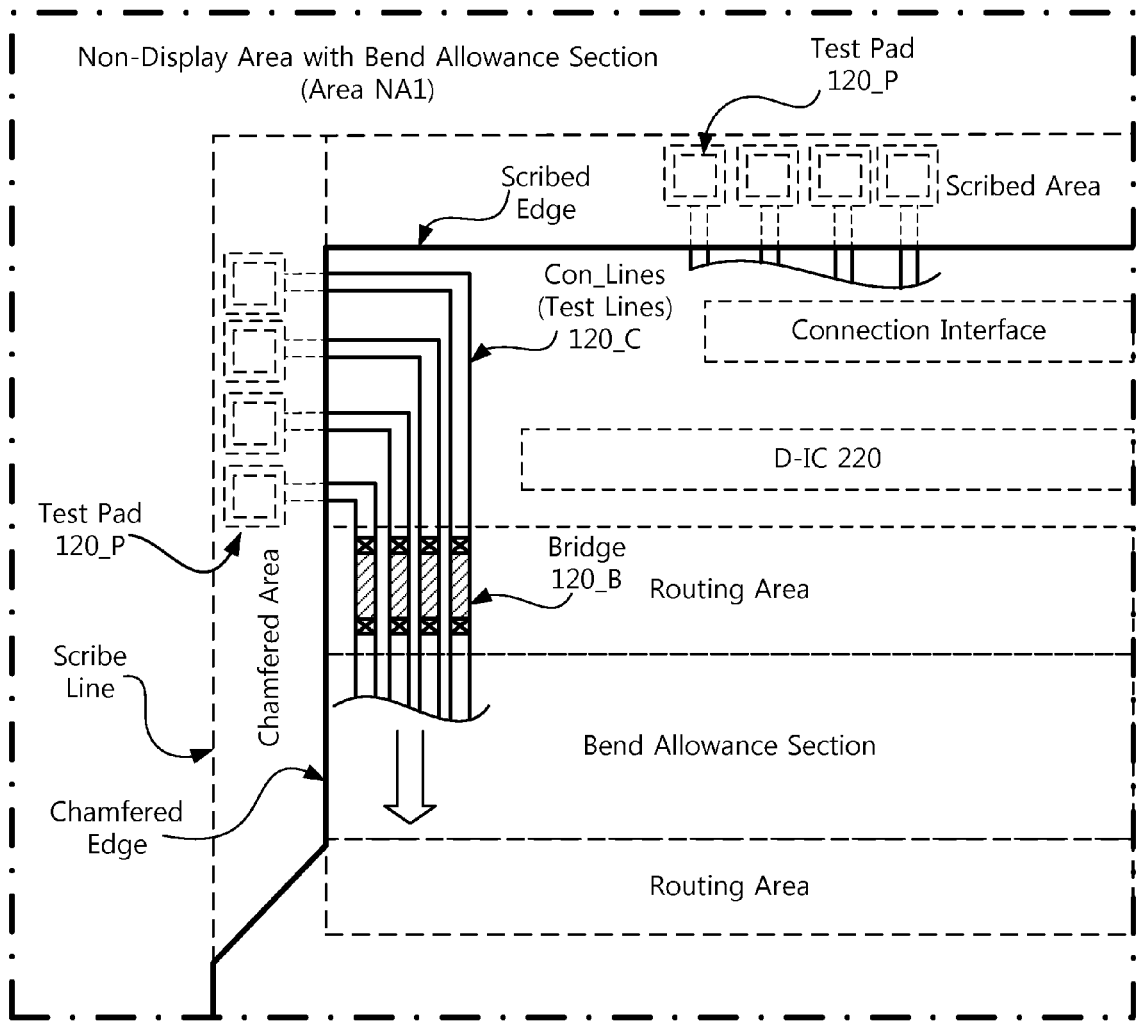
FIG. 6A illustrates exemplary arrangement of bridged conductive lines in a non-display area with a bend allowance section according to embodiments of the present disclosure.

FIG. 6A illustrates a non-display area of the flexible display 100, in which a bend allowance section is provided. For instance, the configuration shown in FIG. 6A may be used in area NA1 of FIG. 1A. Referring to FIG. 6A, the test lines 120_C and test pads 120_P can be placed in the non-display area where the bend allowance section is located. In particular, the test pads 120_P can be provided in the area that is to be notched away by the chamfering process.

The non-display area with the bend allowance section may not have sufficient room to accommodate testing pads 120_P, especially if connection interfaces for connecting external printed circuit board are provided in that non-display area. In such cases, the test line 120_C may be routed across the bend allowance section. Further, the test line 120_C may be arranged to overlap other conductive lines provided in the routing area, and it can cause undesired parasitic capacitance issues.

Figure 6B:
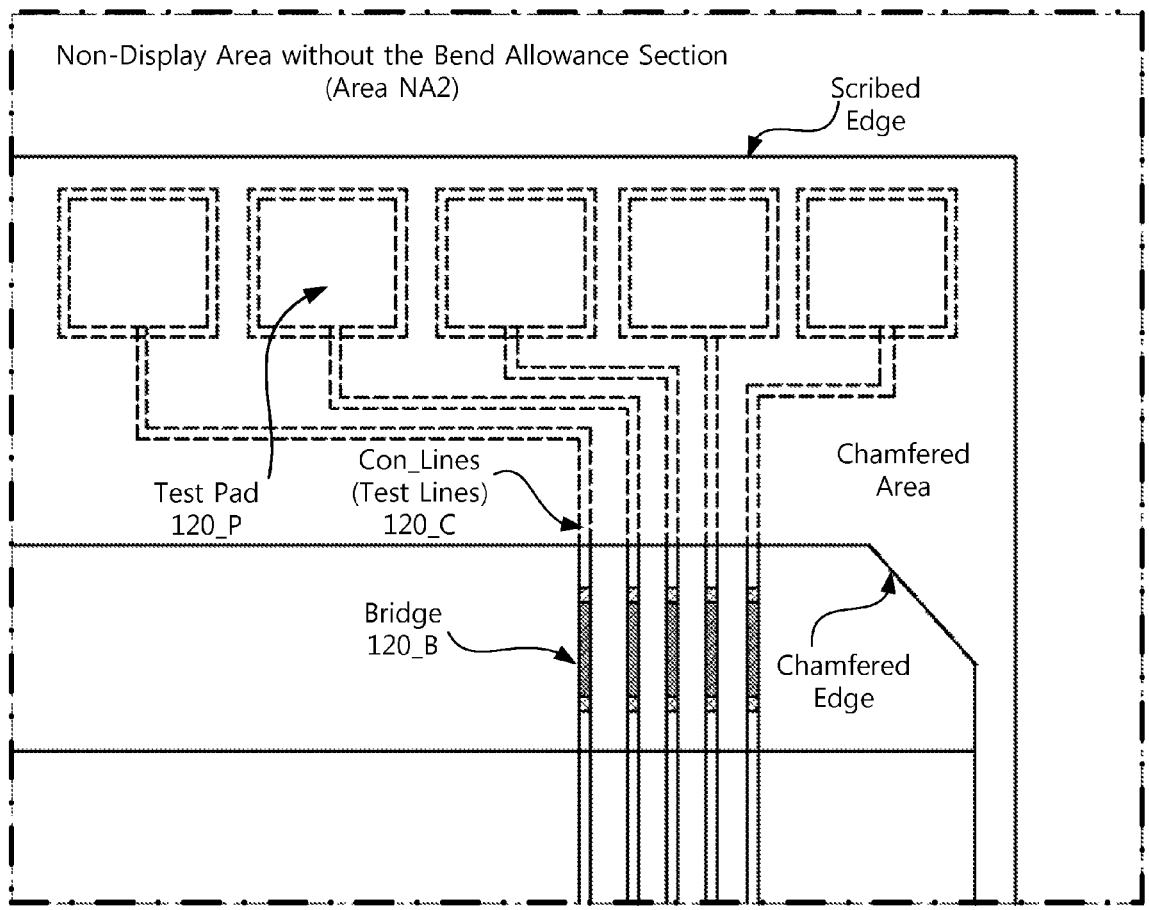
FIG. 6B illustrates exemplary arrangement of bridged conductive lines in a non-display area without a bend allowance section according to embodiments of the present disclosure.

Accordingly, in some other embodiments, the testing pads may be provided in the non-display area other than the ones provided with the connection interfaces for connecting printed circuit board (PCB). As shown in FIG. 6B, the testing pads 120_P can simply be placed outside the chamfering line of the base layer 106 so that they are removed from the flexible display 100 after the chamfering process.

Regardless of where the testing pads 120_P were placed, the part of the test lines 120_C remaining on the base layer 106 will be extended until the scribed/chamfered edge of the base layer 106, and the exposed surface of the test lines 120_T at the scribed/chamfered edge of the base layer 106 can be highly susceptible to galvanic corrosion.

Electronic device employing the flexible display 100, for instance a wearable electronic device or a water submergible electronic device, may expose the flexible display 100 in a humid environment. In some cases, moist can reach the conductive line 120. Dissimilar metals and alloys have different electrode potentials, and when two or more come into contact in an electrolyte, one metal acts as anode and the other as cathode. The electro-potential difference between the dissimilar metals accelerates corrosion on the anode member of the galvanic couple, which would be the primary conductive layer 122 in the multi-layered conductive line 120 (e.g., Al layer in the Ti/Al/Ti stack). The anode metal dissolves into the electrolyte, and deposit collects on the cathodic metal.

Corrosion at one point can grow along the conductive line and cause various defects within the flexible display 100. In order to suppress the growing of the corrosion, a bridge structure 120_B can be provided in the conductive line (e.g., the test lines 120_C), which is to be cut by the scribing or chamfering processes during manufacturing of the flexible display 100. More specifically, the conductive line 120_C can include at least two parts. The part of the conductive line extended to the scribed/chamfered edge of the base layer 106 is separated apart from the rest of the conductive line remaining on the base layer 106. These separated conductive line parts are connected by a conductive bridge 120_B, which is arranged to be in contact with each of the separated parts of the conductive line through contact holes in one or more the insulation layer(s).

Before a part of the conductive line on the base layer 106 is cut by the scribing/chamfering processes, signals can be transmitted between the separated conductive line parts via the conductive bridge 120_B. After the part of the conductive line is cut by the scribing/chamfering process, the corrosion which may start from the scribed edge or the chamfered edge is suppressed from growing along the conductive line due to the space between the separated conductive line parts. Although the bridge 120_B is in contact with the separated parts of the conductive line, the bridge 120_B is located in a different layer from the conductive line 120_C, and it hinders the growth of corrosion past the bridge 120_B.

Figure 7A:
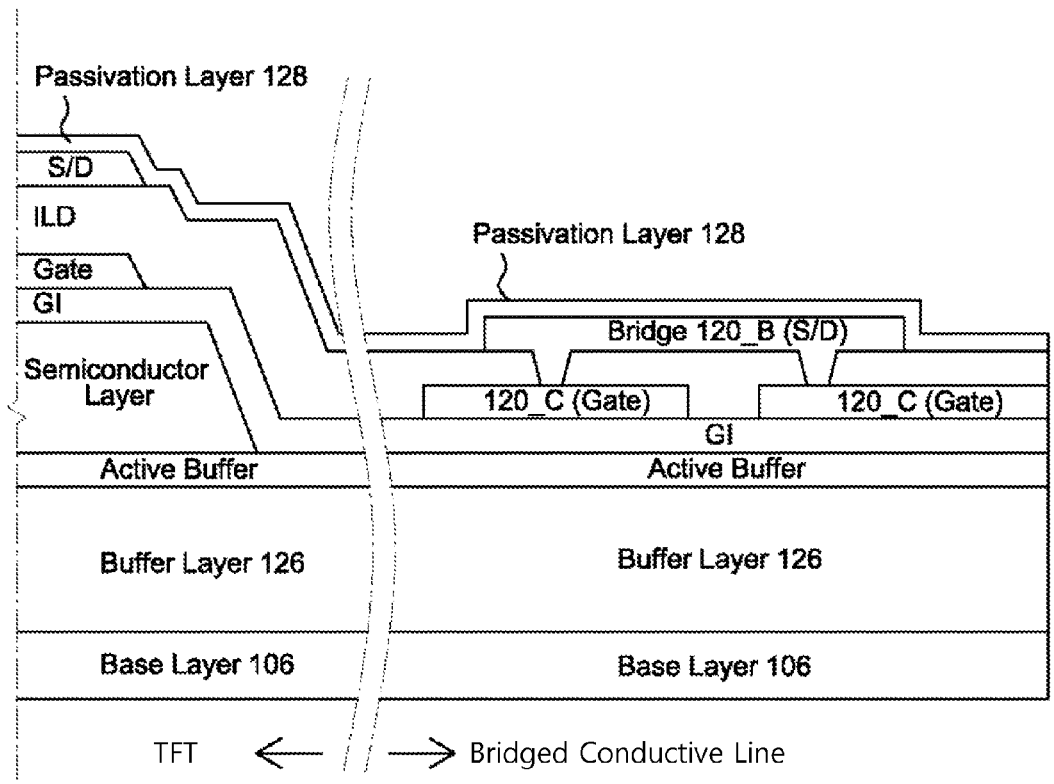
FIGS. 7A and 7B each illustrates a cross-sectional view of an exemplary configuration of bridged conductive lines according to embodiments of the present disclosure.

FIG. 7A illustrates a cross-sectional view of an exemplary embodiment of flexible display 100 provided with bridged conductive lines. In the embodiment shown in FIG. 7A, the separated conductive line parts are provided in the same metal layer as the gate electrode of at least some of the TFTs provided on the base layer 106. Also, the bridge can be provided in the same metal layer as the source/drain electrodes of the TFTs. The interlayer dielectric layer (ILD) between the source/drain electrodes and the gate electrode of the TFTs may also be provided between the bridge 120_B and the separated conductive line parts 120_C, and the bridge 120_C can be in contact with the conductive line parts 120_C via contact holes in the ILD.

The gate insulation (GI) layer provided between the gate electrode and the semiconductor layer of the TFTs may also be provided under the separated parts of the conductive line. Optionally, the buffer layer 126 and the active buffer layer under the semiconductor layer of the TFTs can be provided under the conductive line parts 120_C. The passivation layer 128 on the source/drain electrode of the TFTs can be provided over the bridge 120_B as well. As will be described in further detail below, these insulation layers provided on or below the bridge 120_B and the conductive line parts 120_C can be patterned to suppress crack propagation in the wire traces.

It should be noted that the semiconductor layer as well as some of the insulation layers provided in the TFT area may not be provided in the area where the bridged conductive line is placed. As such, although the separated conductive line parts 120_C and the gate electrode of the TFTs are provided in the same metal layer, they need not be in the same plane level as each other. In other words, the gate electrode of the TFTs and the conductive line parts 120_C can be formed by deposition of the same metal layer, but their plane level may be different by the structure of the layers under the metal layer. Likewise, the bridge 120_B for connecting the separated conductive line parts 120_C and the source/drain electrodes of the TFTs can be provided in the same metal layer, yet be in a different plane level from each other.

Figure 7B:
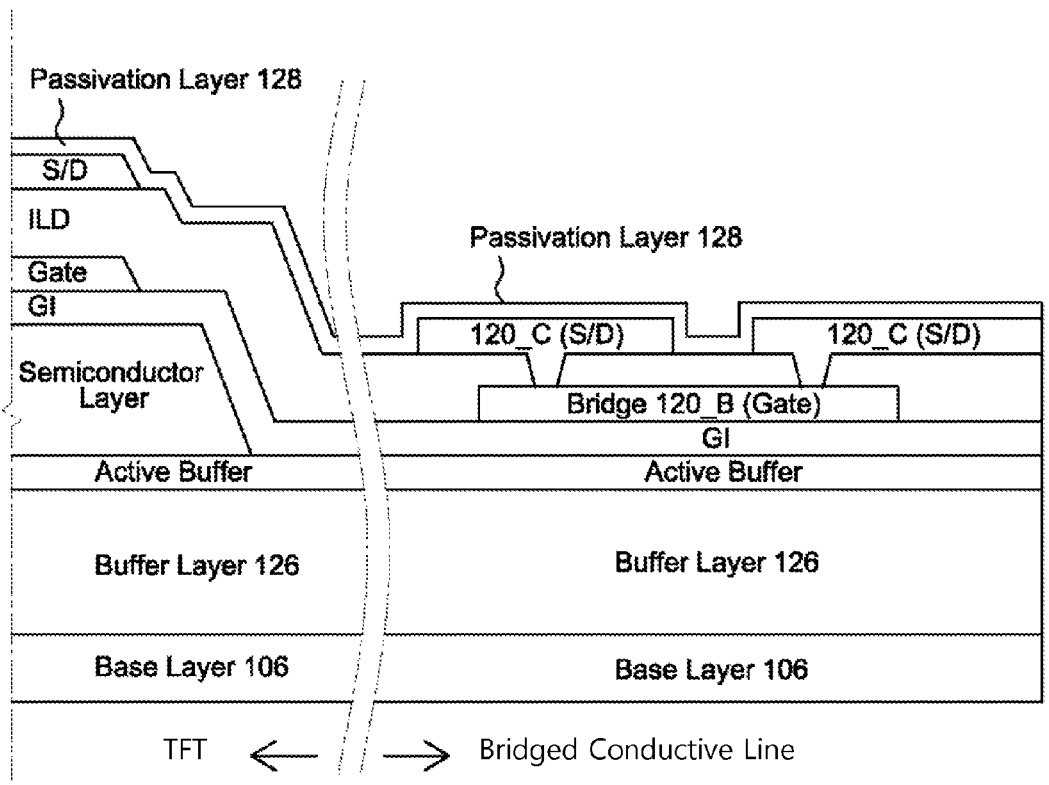

FIG. 7B is a cross-sectional view illustrating another exemplary embodiment of the flexible display 100 provided with bridged conductive lines. In the embodiment depicted in FIG. 7B, the bridge 120_B is provided under the separated conductive line parts 120_C. More specifically, the bridge 120_B is provided in the same metal layer as the gate electrode of the TFTs in the flexible display 100, and the conductive line parts 120_C are provided in the same metal layer as the source/drain electrodes of the TFT. In this case, each of the separated conductive line parts 120_C will be in contact with the bridge 120_B through the contact holes in the insulation layer between the conductive line parts 120_C and the bridge 120_B positioned thereunder.

In the embodiments depicted in FIGS. 7A and 7B, the metal layers, in which the conductive line parts 120_C and the bridge 120_B are formed in, are described in reference to the metal layers used for providing electrodes of co-planar type TFT. However, it should be noted that the flexible display 100 can include TFTs with staggered and/or inverted staggered structures (i.e., top gated or bottom gated staggered TFTs). Accordingly, metal layers for implementing the separated conductive line parts 102_C and the bridge 120_B may vary based on the stack structure of the TFTs in the flexible display 100. Also, various insulation layers other than the ILD, for instance gate insulation layer, passivation layer, planarization layer and the likes, may be provided in between the separated conductive line parts 120_C and the bridge 120_B based on the structure of the TFTs.

Furthermore, it should be appreciated that the layer for implementing the conductive line parts 120_C and the bridge 120_B are not limited to the layers used for the gate electrode or the source/drain electrodes of the TFTs in the flexible display 100. Any conductive layers in the flexible display 100 may be used to provide the conductive line parts 120_C and the bridge 120_B so long as there is at least one insulation layer between the conductive line parts 120_C and the bridge 120_B. For example, any one of the conductive line parts 120_C and the bridge 120_B may be implemented with an inter-metal layer, which may be used is some of the TFTs in the flexible display 100. Also, a touch sensor may be integrated in the flexible display 100, and the conductive layer for implementing the touch sensor can be used in providing any one of the conductive line parts 120_C and the bridge 120_B in the flexible display 100. In embodiments of the flexible display 100 using oxide TFTs, the metal oxide layer used for providing the active layer of the TFT can be patterned as the conductive line parts 120_C or the bridge 120_B. Post treatment can be performed on the metal oxide layer patterned as the conductive line parts 120_C or the bridge 120_B to obtain a desired conductivity.

Trace Design

A trace design of a conductive line 120 is an important factor, which can affect the conductive line's electrical and mechanical properties. To meet the electrical and mechanical requirements, some portion of a conductive line 120 may be configured differently from another portion of the conductive line 120. As such, a portion of a conductive line at or near the bend allowance section of the flexible display 100 may be provided with several features for bend stress management.

Bend stress management of the insulation layers near the conductive line 120 is just as important as the managing the strain of the conductive line itself. Various insulation layers, such as the buffer layer 126, the passivation layer 128, a gate insulation layer (GI layer) and an interlayer dielectric layer (ILD layer) positioned below and/or above the conductive line 120 may include a layer of inorganic materials. Layers that are formed of inorganic material, for instance a silicon oxide layer and a silicon nitride layer, are generally more prone to cracks than the metal layers of the conductive line. Even when the conductive lines have a sufficient flexibility to cope with the bend stress without a crack, some of the cracks initiated from the insulation layer can propagate into the conductive lines and create spots of poor electrical contacts in the flexible display 100.

In addition to applying a trace design for reducing bend stress on a conductive line, some of the insulation layers above and/or below the layer of conductive line may be patterned according to the trace design of the conductive line to minimize the chance of cracks. Various insulation layer patterning methods, such as wet etching and/or dry etching processes, can be used to form a trace of insulation layer that corresponds to the trace of a conductive line. Lack of insulation layer, especially the inorganic material based insulation layer around the trace of a conductive line not only lowers the chance of crack generation, but it also cuts off the path for a crack propagation. For convenience of explanation, a trace of conductive line 120 and a trace of insulation layers covering at least some part of the conductive line 120 are collectively referred to as the "wire trace" in the following description.

Strain on a wire trace from the bend stress will be greater as the direction in which the wire trace extends is more aligned with the tangent vector of the curvature. In other words, a wire trace will withstand better against the bend stress if the length of a wire trace segment being parallel to the tangent vector of the curvature is reduced. No matter which direction the wire trace is extended to, there will always be a portion in the wire trace that is measurable in the bending direction. However, a length for each continuous measurable portion (i.e., a segment) being aligned parallel to the bending direction can be reduced by employing a strain-reducing trace design in the wire trace.

Figure 8A:
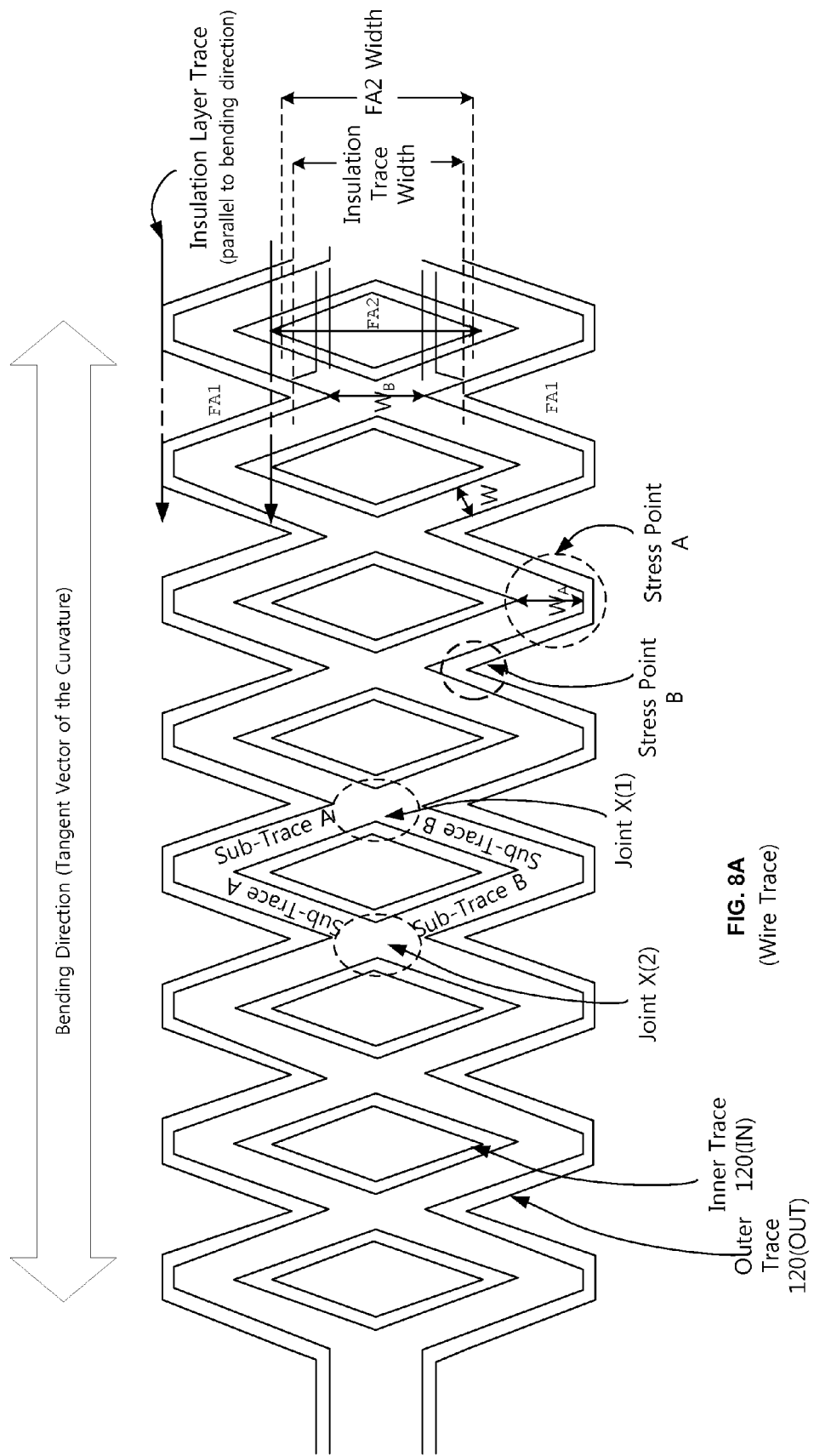
FIGS. 8A and 8B illustrate a schematic view of exemplary strain-reducing wire trace designs having a plurality of sub-traces that split and merge at a certain interval according to embodiments of the present disclosure.

FIG. 8A illustrates an exemplary strain-reducing trace designs. A wire trace may employ a trace design in which the wire trace repeatedly splits and converges back in a certain interval. In other words, a wire trace includes at least two sub-traces arranged to form a trace design resembling a chain with a series of connected links. The angles of split and merge define the shape of each link, which allows to limit the length of the wire trace segment measurable in straight line parallel to the bending direction.

Referring to FIG. 8A, the conductive line 120 includes sub-trace A and sub-trace B, which are split away from each other and merge back at each joint X. Between the first joint X(1) and the second joint X(2), a part of the sub-trace A is extended for a predetermined distance in a first direction angled away from the tangent vector of the curvature, and another part of the sub-trace A is extended in a second direction. The sub-trace B is arranged in a similar manner as the sub-trace A, but in a mirrored orientation in reference to the tangent vector of the curvature. The distances and directions in which the sub-traces are arranged between the two adjacent joints X define the shape and the size of the link in the chain as well as the open area surrounded by the sub-traces. In this example, the shape of the conductive line 120 between the joint X(1) and X(2) (i.e., link) has a diamond shape with an open area surrounded by the sub-trace A and the sub-trace B. With additional joints X, the conductive line 120 forms a chain of diamond shaped links, and thus the trace design may be referred to as the diamond trace design. Employing such a strain-reducing trace design increases the portion of the wire trace arranged in a slanted orientation with respect to the tangent vector of the curvature. This, in turn, limits the length of the wire trace segment extending in a straight line parallel to the bending direction.

The strain-reducing trace design shown in FIG. 8A can provide significant advantages in terms of electrical property. For instance, the wire trace provided with the split/merge trace design can provide much lower electrical resistance than the wire traces employing non-split strain-reducing trace designs such as the sign-wave or the serpentine trace designs. In addition, sub-traces can serve as a backup electrical pathway in case one of the sub-traces is damaged or severed by cracks.

Since the cracks in the wire trace by bending of the flexible display generally initiate from an inorganic insulation layer, it is imperative that the length of the insulation layer trace being aligned with the tangent vector of the curvature is also minimized. Accordingly, the insulation layers covering the surfaces of the conductive line 120 may also be patterned in a trace design corresponding to the trace design of the conductive line 120. For example, the insulation layer under the conductive line 120 can be etched away. The insulation layer under the conductive line 120 may be the buffer layer 126, which may include one or more layers of inorganic material layers. The buffer layer 126 may be formed of one or more layers of a $SiN_x$ layer and a $SiO_2$ layer. In one suitable configuration, the buffer layer 126 may be formed of alternating stacks of a $SiN_x$ layer and a $SiO_2$ layer. The buffer layer 126 is disposed on the base layer 126, but under the TFT.

In the substantially flat portion of the flexible display 100, additional layer of inorganic layer may be provided immediately below the semiconductor layer of the TFT, which may be referred to as the active buffer. In some embodiments, an inorganic layer, which is most closely positioned under the active layer of the TFT, may be much thicker than the individual inorganic layers of the buffer layer 126.

The buffer layer 126 in the bend allowance section may be etched even further to expose the base layer 106 while leaving the buffer layer 126 intact under the conductive line 120. In other words, a recessed area and a protruded area are provided in the bend portion of the flexible display 100. The protruded area includes the buffer layer 126 provided on the base layer 106, whereas the recessed area has the base layer 106 exposed without the buffer layer 126 disposed thereon.

As such, the open area surrounded by the sub-trace A and the sub-trace B is free of the inorganic insulation layer(s), or has thinner inorganic insulation layer(s) than the areas under and/or above the trace of conductive line 120. As such, the length of the insulation layer trace measurable in straight line parallel to the bending direction can be limited to reduce the chance of crack initiation and propagation.

Various additional factors must be considered for the strain-reducing trace designs based on a plurality of sub-traces. The split/merge angles and the length of each sub-traces between two adjacent joints X should provide an offset for the inorganic insulation layer at the joints X and at the outer corners where the sub-trace changes its direction between two adjacent joints X. To put it in another way, the open area, which is surrounded by the split sub-traces between two joints X of the wire trace, should have a size and a shape to minimize the length in which an inorganic insulation layer trace of the wire trace extending parallel to the bending direction.

In the diamond trace design depicted in FIG. 8A, the buffer layer 126 and the passivation layer 128 covering the trace of the conductive line 120 are patterned with a predetermined margin from the outer trace (i.e., outer edge) of the conductive line 120. Other than the insulation layers with the predetermined margin remaining to cover the conductive line 120, the open area surrounded by the sub-traces A and B, which is denoted as FA2, is free of the insulation layers. As such, a trace of insulation layers is formed in accordance with the trace design of the conductive line 120. The length of the open area without the insulation layers measured in orthogonal direction from the bending direction is greater than the width of the inorganic insulation layer trace at the joint X measured in the same direction. In this setting, the open area FA2 surrounded by the sub-traces A and B as well as the area next to the joint X can be free of the inorganic insulation layers, or otherwise provided with a reduced number of inorganic insulation layers.

The insulation layer free area FA1 prohibits the insulation layer of the sub-trace A and the sub-trace B between the two joints X(1) and X(2) to be extended in a continuous straight line. Similarly, the insulation layer free area FA2 prohibits the insulation layer between the two joints X(1) and X(2) to be extended in a continuous straight line. Accordingly, the length of each segment of the insulation layer trace being aligned to the tangent vector of the curvature is minimized.

Further reduction in the length of the insulation layer trace aligned to the tangent vector of the curvature can be obtained by reducing the width of the conductive line 120 and the margin of the insulation layer beyond the edge of conductive line 120. It should be noted that the low electrical resistance offered by the trace designs of the present disclosure provide greater freedom in reducing the width of conductive line 120.

The strain-reducing trace design illustrated in FIG. 8A is merely exemplary, and other trace designs for reducing the length of a wire trace segment parallel to the bending direction may be used in various embodiments of the flexible display 100. Further, it should be noted that some wire traces may adopt different strain-reducing trace design from other wire traces in a flexible display 100 depending on their electrical and/or mechanical requirements. For instance, a strain-reducing trace design used for a data signal line may be different from a strain-reducing trace design used for a power line.

Even with the strain-reducing trace design, the inevitable bend stress remains at certain points of the trace (i.e., stress point). The location of stress point is largely dependent on the shape of the trace as well as the bending direction. It follows that, for a given bending direction, the wire trace can be designed such that the remaining bend stress would concentrate at the desired parts of the wire trace. Knowing the location of the stress point in the wire trace, a crack resistance area can be provided to the stress point to make the wire trace last longer against the bend stress.

When a wire trace having the diamond trace design is bent in the bending direction, the bend stress tends to focus at the angled corners (i.e., the vertexes of each diamond shaped link), which are denoted as the stress point A and stress point B. As such, cracks tend to initiate and grow between the inner and outer edges of the wire trace. For instance, at the stress points A, a crack may initiate from the inner trace line 120(IN) and grow toward the outer trace line 120(OUT). Similarly, a crack may initiate from the outer wire trace line 120(OUT) and grow toward the inner trace line 120(IN) at the stress points B.

Accordingly, the width of the conductive line 120 at the stress points A can be selectively increased to serve as the crack resistance area. As depicted in FIG. 8A, the widths ($W_A$, $W_B$) of the conductive line 120 at the stress points A and B, which are measured in the direction perpendicular to the bending direction, may be longer than the width (W) of the conductive line 120 at the parts between the stress points A and B. The extra width at the stress points can make the conductive line 120 hold out longer before a complete severance in the conductive line 120 occurs by the growth of a crack at the stress points.

It should be reminded that the length for the continuous portion of the insulation layer trace being aligned to the bending direction should be kept minimal. Increasing the width of the conductive line 120 at the stress points A and B may necessitate increase in the width of the insulation layer trace at the respective area, which results in lengthening the insulation layer trace being aligned parallel to the bending direction.

Accordingly, in some embodiments, the width of the conductive line 120 measured in the direction perpendicular to the tangent vector of the curvature at the stress points A ranges from about 2.5 um to about 8 um, more preferably, from about 3.5 um to about 6 um, more preferably from about 4.5 um to about 8.5 um, and more preferably at about 4.0 um. The width of the conductive line 120 at the stress points B should also be maintained in the similar manner as the width of the conductive line 120 at the stress points A. As such, the width of the conductive line 120 at the stress points B may range from about 2.5 um to about 8 um, more preferably, from about 3.5 um to about 6 um, more preferably from about 4.5 um to about 8.5 um, and more preferably at about 4.0 um. Since the sub-trace A and the sub-trace B merges at the stress point B, the width of the conductive line 120 at the stress points B may be longer than width at the stress points A.

In some embodiments, one of the inner trace line 120(IN) and the outer trace line 120(OUT) may not be as sharply angled as the other trace line at the stress points A to minimize the chance of crack initiating from both sides. In the embodiment depicted in FIG. 8A, the inner trace line 120(IN) is more sharply angled than the outer trace line 120(OUT) at the stress points A. However, in some other embodiments, the outer trace line 120(OUT) may be more sharply angled than the inner trace line 120(IN) at the stress points A. In both cases, the less sharply angled trace line can simply be more rounded rather than being a straight line as the outer trace line 120(OUT) depicted in FIG. 8A. Further, both the inner trace line 120(IN) and the outer trace line 120(OUT) at the stress points A can be rounded.

Figure 8B:
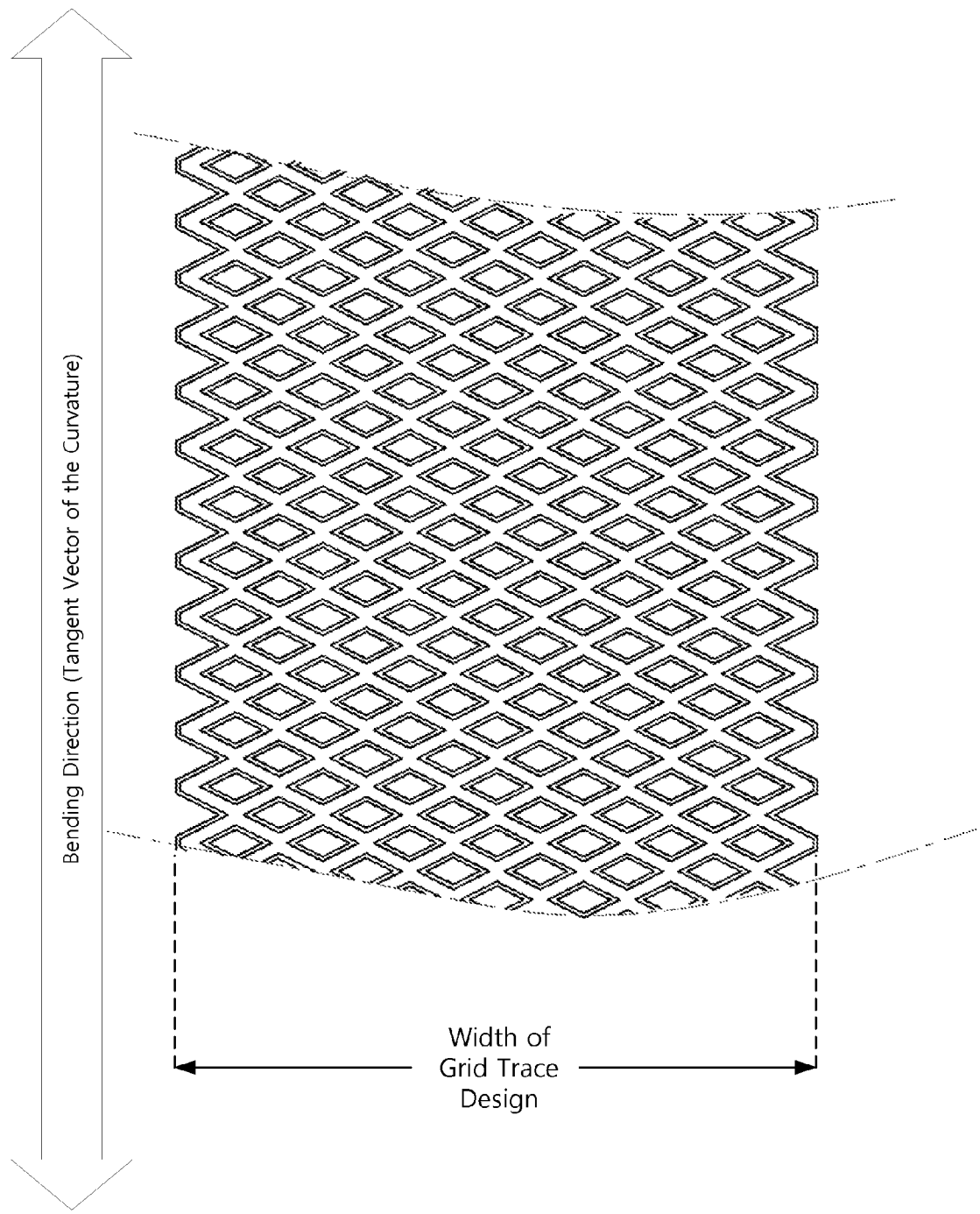

The wire trace may split into additional number of sub-traces, resulting series of links arranged in a grid-like configuration. As an example, a wire trace can be configured as a web of diamond trace shapes as illustrated in FIG. 8B. Such a trace design is particularly useful for a wire trace that transmit a common signal to multiple points or for a wire trace that require a very low electrical resistance. For example, a VSS line and a VDD line in the flexible display 100 may have the grid-like trace design, especially if such lines are arranged to cross over a bend allowance section. Neither the number of sub-traces nor the shapes of the sub-traces of the grid-like trace design are particularly limited as the exemplary design depicted in FIG. 8B.

In some embodiments, the grid width can be reduced or increased in between two ends within the flexible display 100. Also, the grid-like wire trace shown in FIG. 8B can converge back to form the diamond trace shown in FIG. 8A or into other trace designs. In some cases, the size of each diamond-shaped trace of a grid-like wire trace may be larger than the size of each diamond-shaped trace of a diamond-chain trace to reduce the resistance.

Wire Trace Arrangement

Due to the portions angled away from the bending direction, a wire trace with a strain-reducing trace design may necessitate a larger routing area within the flexible display 100. In embodiments where a non-display area at the edge of the flexible display 100 is bent, the increase in the routing area for accommodating the wire traces can actually increase the size of the inactive area to be hidden under a masking.

Accordingly, wire traces applied with a strain-reducing trace design may be arranged to facilitate tight spacing between adjacent wire traces. For instance, two adjacent wire traces with a strain-reducing trace design may each include a non-linear section, which would have a convex side and a concave side. The two adjacent wire traces can be arranged in the flexible display such that the convex side of the non-linear section in the first wire trace is positioned next to the concave side the non-linear section in the second wire trace. Since the spacing between the two adjacent wire traces is limited by the shape and the size of the wire traces, the non-linear section in the strain-reducing trace design of the first wire trace may be larger than the non-linear section in the strain-reducing trace design of the second wire trace. Of course, one of the first wire trace and the second wire trace may have a different strain-reducing trace design to better accommodate the non-linear section of the other wire trace.

In some instances, two or more wire traces arranged next to each other may each be applied with a strain-reducing trace design, and each of the wire traces may have a plurality of indented sections and distended. In such cases, the wire traces can be arranged such that the distended section of one of the wire traces to be positioned next to the indented sections of the adjacent wire trace.

Figure 8C:
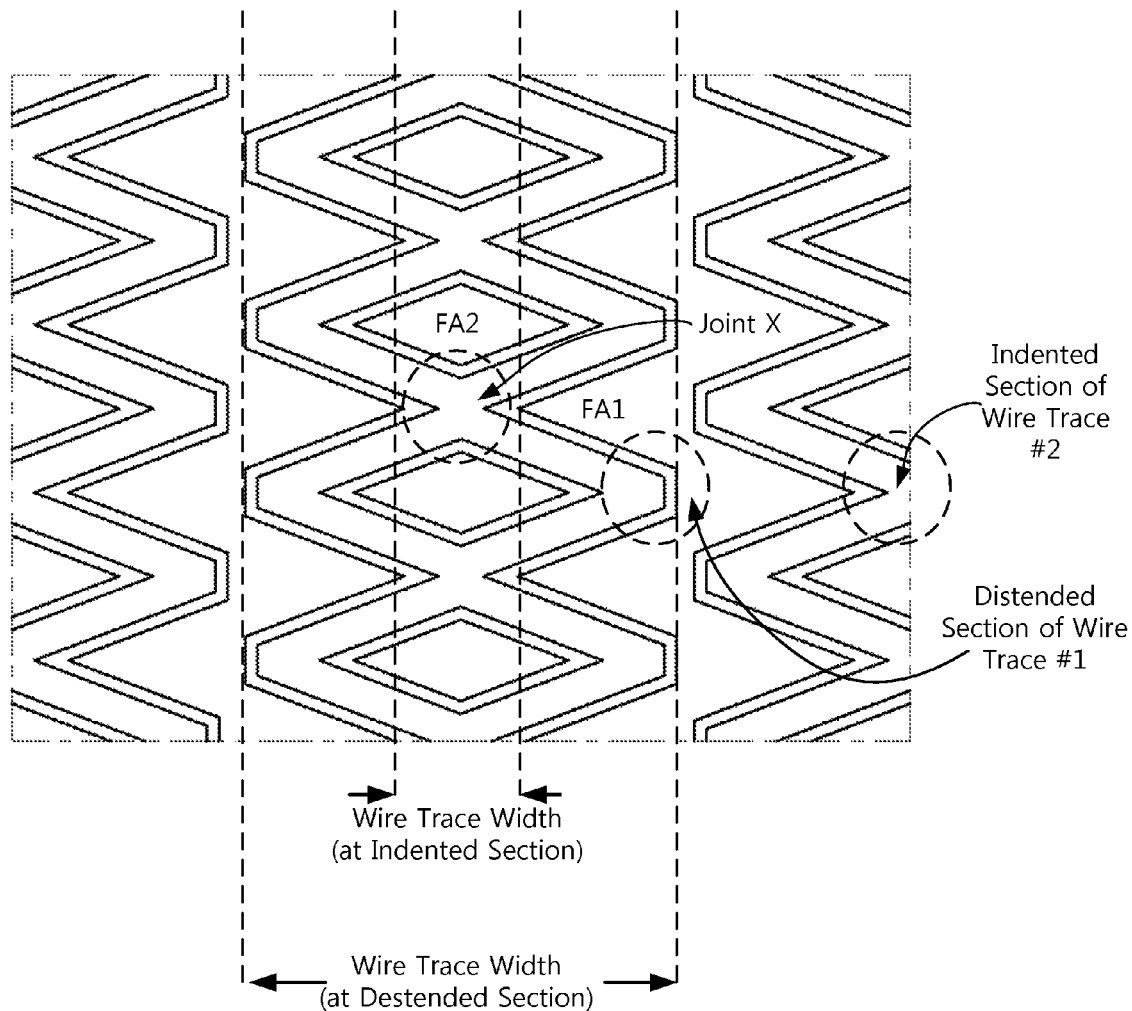
FIG. 8C illustrates an exemplary arrangement of the wire traces including indented sections and distended sections.

FIG. 8C illustrates an exemplary arrangement of multiple wire traces, each having the diamond trace design described above. The split of the sub-traces widens the layout of the wire trace to create the distended section, whereas merging of the sub-traces narrows the layout of the wire trace to create the indented section. Accordingly, in terms of its layout, the indented section of the wire trace is at the joint X, whereas the distended section of the wire trace is at the point where the split/merge angles of the sub-traces change between two adjacent joints X.

As shown in FIG. 8C, position of the joints X in a first wire trace and the joints X in a second wire trace are arranged in a staggered configuration. In this arrangement, the vertexes of the diamond shaped link at the distended section in the first wire trace are positioned next to the joints X at the indented sections of the adjacent wire traces. Such a staggered arrangement of the wire traces may help in lowering the electrical noises on the wire traces due to close proximity between the wire traces, and thus the distance between the wire traces can be reduced. Even a tight spacing between the wire traces may be possible by arranging the distended section of a wire trace to be positioned closer toward the indented section of the adjacent wire trace. For instance, the vertexes at the wide parts of one wire race can be placed in the open area FA1, which is created by the split/merge angle and the length of the sub-trace in the adjacent wire trace. As such, the staggered arrangement allows to maintain a certain minimal distance between the wire traces while reducing the amount of space taken up by the wire traces.

Micro-Coating Layer

With the absent of various layers in the bend portion of the flexible display 100, a protective layer may be needed for the wire traces, especially for the wire traces in the bend allowance section of the flexible display 100. Also, the wire traces in the bend portion can be vulnerable to moistures and other foreign materials as the inorganic insulation layers can be etched away from in the bend portion of the flexible display 100. In particular, various pads and conductive lines for testing the components during manufacturing of the flexible display 100 may be chamfered, and this can leave the conductive lines extended to the notched edge of the flexible display 100. Such conductive lines can be easily corroded by moistures, which can be expanded to nearby conductive lines. Accordingly, a protective coating layer, which may be referred to as a "micro-coating layer" can be provided over the wire traces in the bend portion of the flexible display 100.

The micro-coating layer 132 may be coated over the bend allowance section in a predetermined thickness to adjust the neutral plane of the flexible display 100 at the bend portion. More specifically, added thickness of the micro-coating layer 132 at the bend portion of the flexible display 100 can shift the plane of the wire traces closer to the neutral plane.

In some embodiments, the thickness of the micro-coating layer 132 in the area between the encapsulation 104 and the printed circuit board 200, which is measured from the surface of the base layer 106, may be substantially the same as the thickness of the encapsulation 104 on the base layer 106 to the top surface of the encapsulation 104.

The micro-coating layer should have sufficient flexibility so that it can be used in the bend portion of the flexible display 100. Further, the material of the micro-coating layer should be a curable material with low energy within a limited time so that the components under the micro-coating layer are not damaged during the curing process. The micro-coating layer 132 may be formed of a photo-curable acrylic (e.g., UV light, Visible light, UV LED) resin and coated over the desired areas of the flexible display 100. In order to suppress permeation of unwanted moistures through the micro-coating layer, one or more getter material may be mixed in the micro-coating layer.

Various resin dispensing methods, such as slit coating, jetting and the like, may be used to dispense the micro-coating layer 132 at the targeted surface. In way of an example, the micro-coating layer 132 can be dispensed by using a jetting valve. The dispensing rate from the jetting valve(s) may be adjusted during the coating process for accurate control of the thickness and the spread size of the micro-coating layer 132 at the targeted surface. Further, the number of jetting valves in dispensing the micro-coating layer 132 over the desired area is not limited, and it can vary to adjust the dispense time and the amount of spread on the dispensed surface before the micro-coating layer 132 is cured.

Figure 9A:
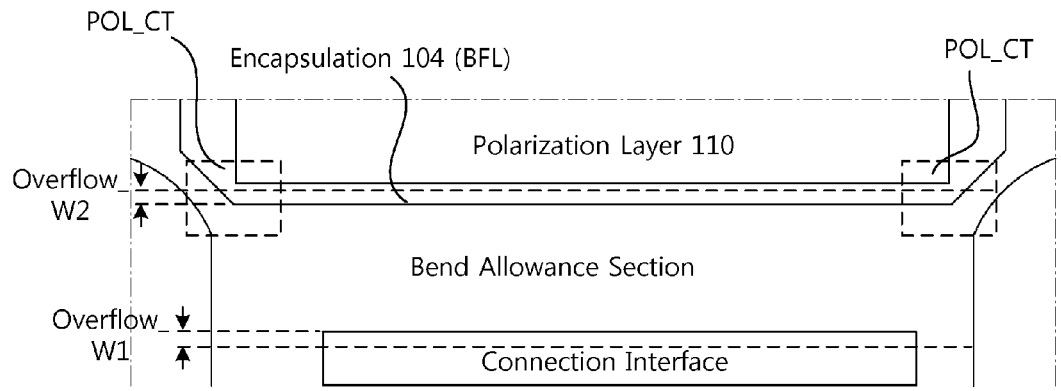
FIGS. 9A-9C illustrate schematic views of the flexible display provided with a micro-coating layer according to embodiments of the present disclosure.

FIG. 9A illustrates one suitable exemplary configuration of the micro-coating layer 132 in an embodiment of flexible display 100. As mentioned, the micro-coating layer 132 can be coated in the area between the encapsulation 104 and the printed circuit board 200 attached in the inactive area. Depending on the adhesive property of the micro-coating layer 132 and the amount of bend stress, however, the micro-coating layer 132 can be detached away from the encapsulation 104 and/or the printed circuit board 200. Any open space between the micro-coating layer 132 and the encapsulation 104 or the printed circuit board 200 can become a defect site where moisture can permeate through.

Accordingly, in some embodiments, the micro-coating layer 132 can be overflowed onto a part of the encapsulation 104 as shown in FIG. 9A. That is, the top surface of the encapsulation 104 at its edge can be coated with the micro-coating layer 132. The additional contact area on the surface of the encapsulation 104 coated by the micro-coating layer 132 suppresses the micro-coating layer 132 from fall apart from the encapsulation 104 by the bend stress. The enhanced sealing provided by the micro-coating layer 132 at the edge of the encapsulation 104 can reduce corrosion of the wire traces at the bend portion of the flexible display 100. Similarly, the micro-coating layer 132 can be overflowed onto at least some part of the printed circuit board 200 for improved sealing by at the edge of the printed circuit board 200.

Figure 9B:
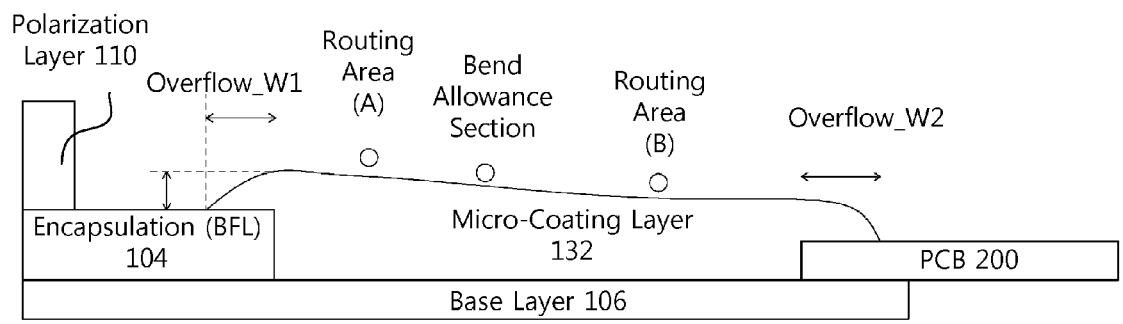
Figure 9C:
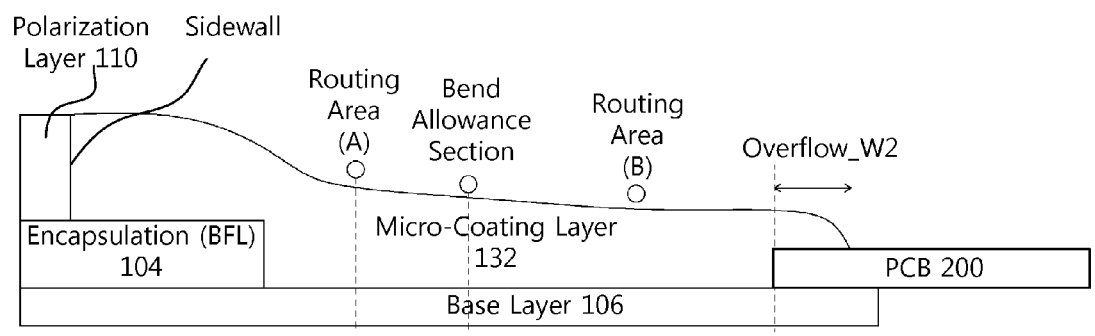

Referring to FIGS. 9B and 9C, the width of the area on the encapsulation 104 coated with the micro-coating layer 134 is denoted as "Overflow_W1", and the width of the area on the printed circuit board 200 coated with the micro-coating layer 134 is denoted as "Overflow_W2." The sizes of the micro-coating layer 134 overflowed areas on the encapsulation 104 and the printed circuit board 200 are not particularly limited and may vary depending on the adhesiveness of the micro-coating layer 132.

As shown in FIG. 9B, the flexible display 100 may include a portion where the micro-coating layer 132 on the encapsulation 104 is spaced apart from the edge of the polarization layer 110. In some embodiments, however, the flexible display 100 may include a portion where the micro-coating layer 132 on the encapsulation 104 is in contact with the polarization layer 110 disposed on the encapsulation 104 as depicted in FIG. 9C.

The spreading dynamic of the micro-coating layer 132 on the dispensed surface depends on the viscosity of the micro-coating layer 132 as well as the surface energy where the micro-coating layer 132 is dispensed. As such, the micro-coating layer 132 overflowed into the encapsulation 104 may reach the polarization layer 110. The micro-coating layer 132 in contact with the sidewall of the polarization layer 110 can help in holding the polarization layer 132 in place. However, the micro-coating layer 132 reaching the sidewall of the polarization layer 114 may climb over the sidewall of the polarization layer 110. Such sidewall wetting of the micro-coating layer 132 can create uneven edges over the surface of the polarization layer 132, which may cause various issues in placing another layer thereon. Accordingly, the amount of the micro-coating layer 134 dispensed on the targeted surface can be adjusted to control the width of the micro-coating layer 134 on the encapsulation layer 114. Further, the micro-coating layer 132 may be dispensed such that only some of the selective areas of the polarization layer 110 are in contact with the micro-coating layer 132.

Figure 10A:
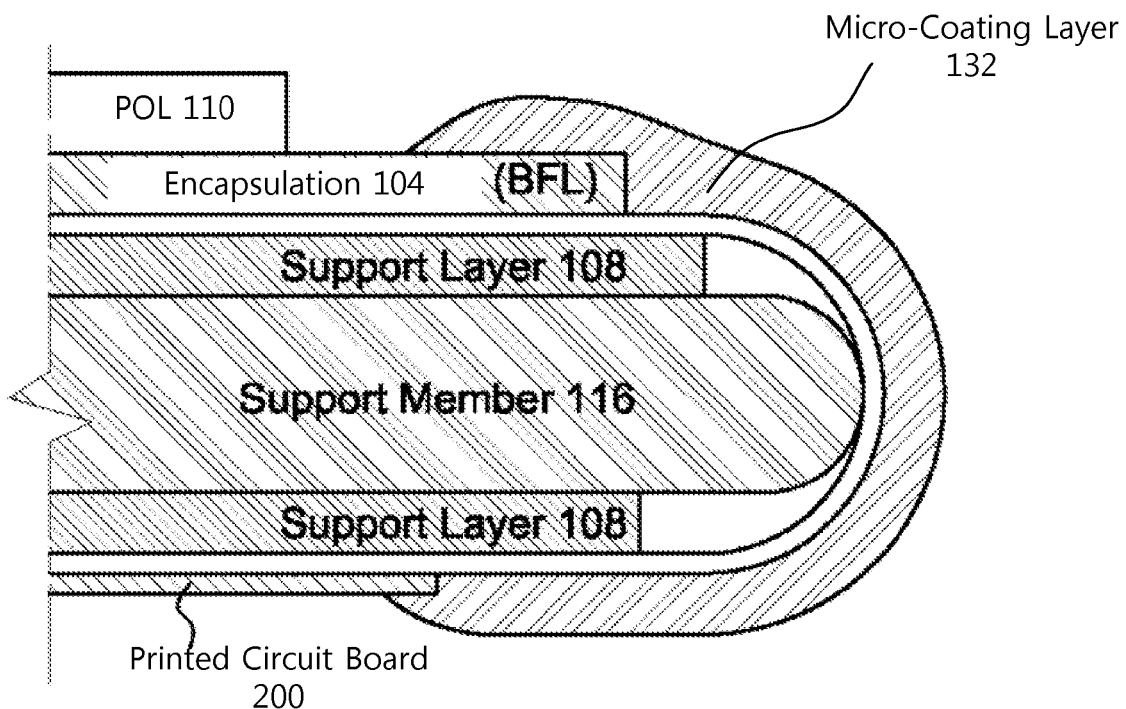
FIGS. 10A and 10B illustrate schematic views of embodiments of the flexible display in a bent state, which are provided with a micro-coating layer according to embodiments of the present disclosure.
Figure 10B:
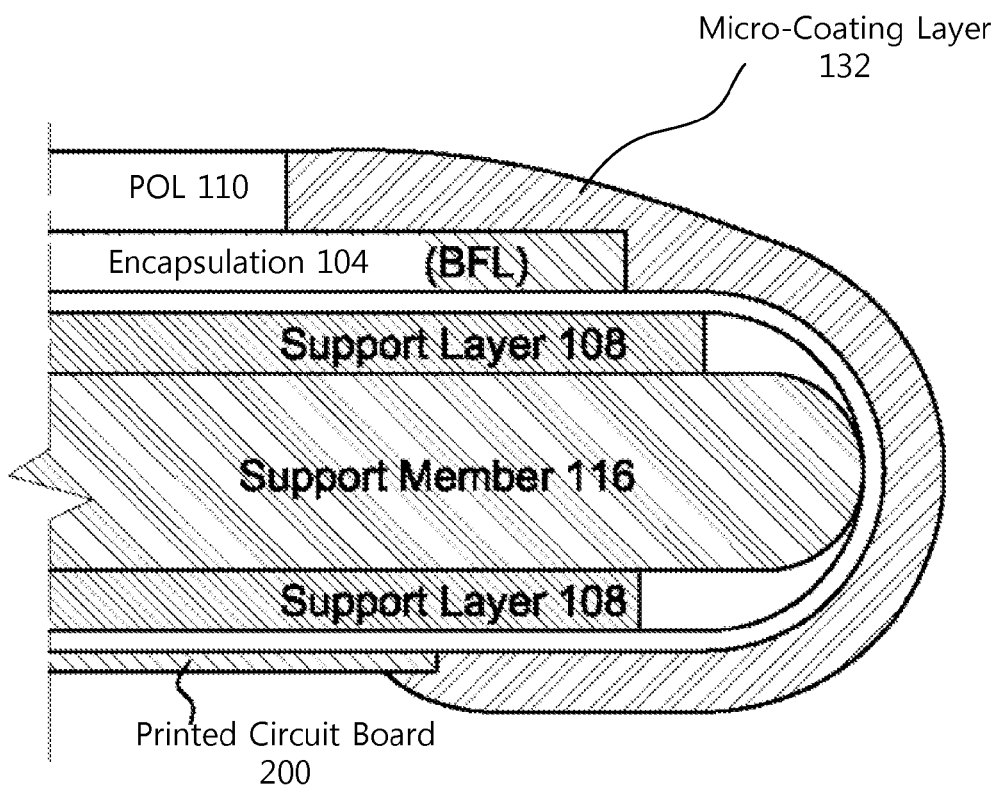

In one suitable configuration, the micro-coating layer 132 may be in contact with the polarization layer 110 at the two opposite corners (denoted "POL_CT" in FIG. 9A) while the micro-coating layer 132 between the two corners does not reach the edge of the polarization layer 110. The micro-coating layer 132 between the two opposite corners (POL_CT) only covers up to some part of the encapsulation 104. After the bending process, the part of the flexible display 100 where the micro-coating layer 132 is spaced apart from the polarization layer 110 may be configured as shown in FIG. 10A. In the region where micro-coating layer 132 is configured to be in contact with the polarization layer 110, the flexible display 100 may be configured as shown in FIG. 10B.

Divided VSS-VDD Wire Trace

Spreading dynamic of the micro-coating layer 132 over the wire traces can be affected by the trace design of the wire traces. More specifically, patterning of the insulation layers along the wire trace in the bend portion of the flexible display 100 creates recessed areas and protruded areas, which essentially become a micro-grooved surface to be covered by the micro-coating layer 132.

When applying the strain-reducing trace design in the wire traces, patterning of the insulation layers around the split sub-traces creates the recessed open area, which is surrounded by the protruded stack of wire traces. During coating of the micro-coating layer 132, some portion of the micro-coating layer droplet can permeate into the recessed open area. It can hinder the spreading and reduce the maximum spreading diameter of the micro-coating layer 132 on such a micro-grooved surface, and result in some part of the bend portion being exposed without the micro-coating layer 132.

Decrease in the wettability of micro-coating layer 132 by the distribution of the recessed areas and the protruded areas may be magnified even more in the area over the wire trace applied with the grid-like trace design shown in FIG. 8B. To counteract the viscid drag, in some embodiments, a wire trace, which includes multiple diamond-chain traces adjoined side-by-side, can be provided with a rail between two parts of the wire trace.

Figure 11:
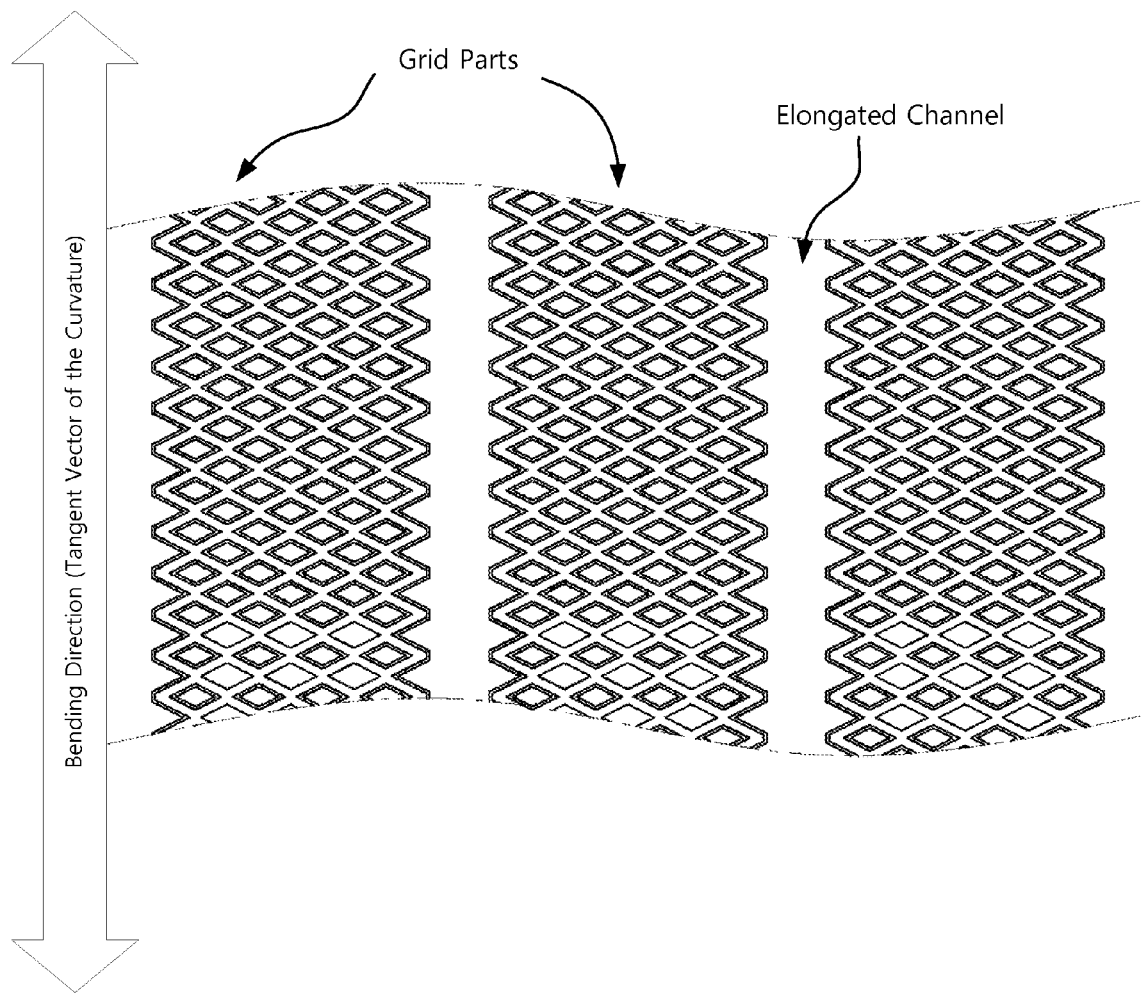
FIG. 11 illustrates a schematic view of an exemplary strain-reducing wire trace design provided with elongated channel(s) for improving spread dynamics of a micro-coating layer.

Referring to FIG. 11, a wire trace with a grid-like trace strain-reducing trace design is provided with an elongated channel between divided grid-parts of the wire trace. Within the elongated channel, the conductive line 120 is not formed. Also, at least some of the inorganic insulation layers on the base layer 106 are removed in the elongated channel. The elongated channel between the grid-parts of the wire trace extends from the signal supplying side to the signal receiving side of the wire trace. That is, the elongated channel may be extended in the direction parallel to the bending direction. It should be noted that the separated parts of the wire trace on one side of the elongated channel is connected to the part of the wire trace on the opposite side of the elongated channel, and thus both parts of the wire trace transmit the identical signal. The connection between the divided parts of the wire trace may be achieved at one or both ends of the wire trace by a conductive path, which may be a part of the wire trace. The connection of the divided parts of the wire trace may be achieved within the bend allowance section or outside the bend allowance section.

Even though the parts of the wire trace on each side of the elongated channel has the grid-like trace design, the reduced number of diamond-chain traces adjoined in each grid-part and the channel between the grid-parts can reduce the viscid drag of the micro-coating layer 132. More importantly, the elongated recessed channel between the parts of the wire trace serves as a path that improves the wettability of the micro-coating layer 132 over the wire trace. In sum, increase in the maximum spread diameter of the micro-coating layer 132 can be achieved by positioning one or more elongated channel within the wire having the grid-like strain-reducing trace design.

It should be noted that the resistance of the wire trace can increase with the elongated channel dividing the wire trace into multiple grid-parts. Increase in the resistance of the wire can raise the temperature of the wire trace when it is supplied with a signal. Accordingly, the number of elongated channels provided in a single wire trace can depend on the signal transmitted via the wire trace. In some cases, the size of each diamond shaped link in a grid-like wire trace may be larger than the size of diamond-shaped links in other wire traces of the flexible display 100.

In one suitable configuration, one or more of power signal wires of the flexible display 100, such as the VDD and/or the VSS, has the grid-like wire trace formed of multiple diamond-chain traces adjoined side-by-side as depicted in FIG. 11. The power signal wire trace includes one or more elongated channels in its grid-like wire trace. Each of the elongated channels is provided between two divided grid parts, which are on the opposite sides of the elongated channel. The divided grid parts are connected at one or both ends of the power signal wire. The size of the divided grid parts may be substantially the same. That is, the number of diamond-chain traces forming a gird part on one side of the elongated channel may be the same as the number of diamond-chain traces forming a gird part on the opposite side. If desired, however, the number of diamond-chain traces adjoined to each other to form one grid part may differ from the number of diamond-chain forming another grid part.

Printed Circuit Board

Figure 12:
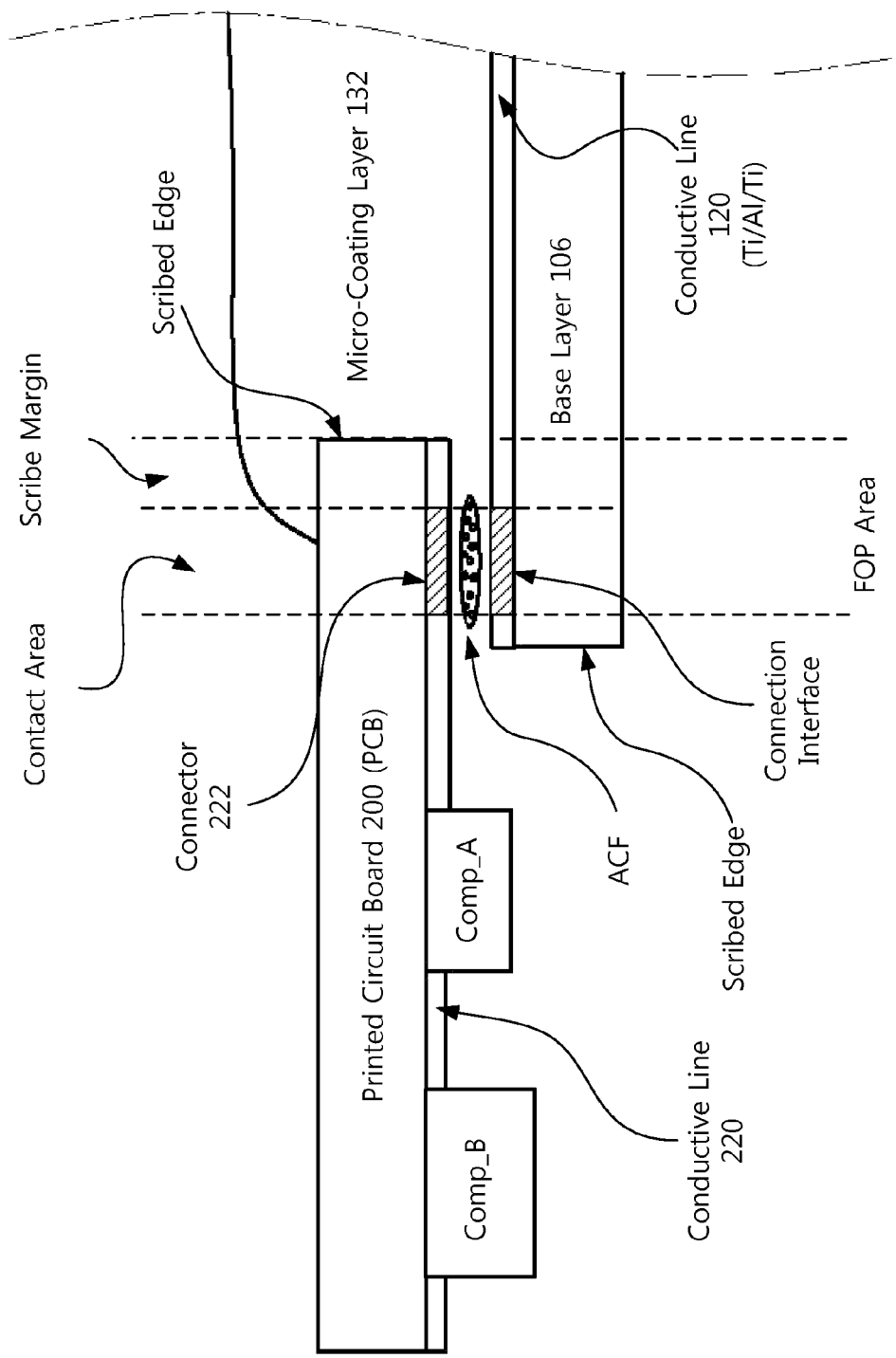
FIG. 12 illustrates schematic view of a flex on panel (FOP) area where a printed circuit board is attached to a base layer if the flexible display according to an embodiment of the present disclosure.

As mentioned, some components that cannot be placed directly on the base layer 106 can be disposed on the printed circuit board 200. Conductive lines on the printed circuit board 200 transmits signals from and to the components provided on the base layer 106 as well as the components disposed on another printed circuit board. Referring to FIG. 12, on one end of the printed circuit board 200, the conductive lines 220 are arranged to be in contact with the conductive lines 120 on the base layer 106. The area where the part of the printed circuit board 200 and the base layer 106 are attached together may be referred to as the "Flex-on-Panel (FOP) area." In some embodiments of the flexible display, another printed circuit board may be attached to the printed circuit board 200. In such cases, the area where the printed circuit boards are attached together may be referred to as the "flex-on-flex (FOF) area."

In the FOP area, some parts of the conductive lines 220 can serve as the connectors 222 (e.g., pads or pins), which is to be connected to the corresponding connection interfaces on the base layer 106. In the contact area, an anisotropic conductive adhesive (e.g., anisotropic conductive film: ACF) or other types of adhesives may be provided. Before bonding the printed circuit board 200 to the base layer 106, tests may be performed to inspect whether the conductive lines 220 on the printed circuit board 200 are properly connected to the components (e.g., D-IC, Power Supply Unit) disposed thereon. However, the pitch of the conductive lines 220 may be very narrow in the FOP area, and thus it is difficult to supply/receive test signals on the conductive lines 220 at such area. Therefore, the conductive lines 220 on the printed circuit board 200 are routed beyond the FOP area to an area where they are arranged with a larger pitch and/or provided with test pads.

FIGS. 13A-13D each illustrates a cross-sectional view of an exemplary configuration of a printed circuit board used in an embodiment of a flexible display 100. One or more components (Comp_A, Comp_B) can be disposed on the printed circuit board 200, and the pins from those components may be connected to some of the conductive lines 220 of the printed circuit board 220. Several other components can also be disposed on the printed circuit board 200. The Component 230 on the printed circuit board 200 may receive image data from another component on the printed circuit board 200 (e.g., from a processor, timing controller, etc.) and produce corresponding control signals for the flexible display 100. Also, a power supply unit for converting the power from a power source into various voltage levels used by the components of the flexible display 100. It should be noted that the components disposed on the printed circuit board 200 are not limited to examples mentioned above. In the figured, the components on the printed circuit board 200 are disposed on the same side of the printed circuit board 200. However, it should be appreciated that components of the flexible display 100 can be placed on both sides of the printed circuit board 200.

Patterns of conductive lines are formed on the printed circuit board between the part with the Comp_A 230 and the part where those other components (e.g., Comp_B 240) are placed. The Comp_A 230 may distribute signals to the display pixels or other components on the base layer 106 via the conductive lines 220 provided on the side to be attached to the base layer 106. In this regard, a contact area is provided in a part of the printed circuit board 200 so that exposed portion of the conductive line 220 can be connected to the connection interface on the base layer 106. The conductive lines 220 on the printed circuit board 200 can be covered by a layer of an insulating material (e.g., the solder resist: SR).

In some cases, the Comp_A 230 may be positioned between the contact area and other components disposed on the printed circuit board 200, for instance the Comp_B 240. Space for conductive line patterns on the printed circuit board 200 can quickly run out with more components disposed on the printed circuit board 200. The pattern of conductive lines 220 between the COMP_A 230 and the contact area may be simpler than the pattern of conductive lines 220 between COMP_A 230 and other components provided on the printed circuit board 200. For instance, the conductive line pattern forming data signal lines (source channel pattern) can be formed without crossing another line, but the conductive line patterns for connection between the COMP_A 230 and other components on the printed circuit board 200 may have to cross over another conductive line in the printed circuit board 200.

Figure 13A:
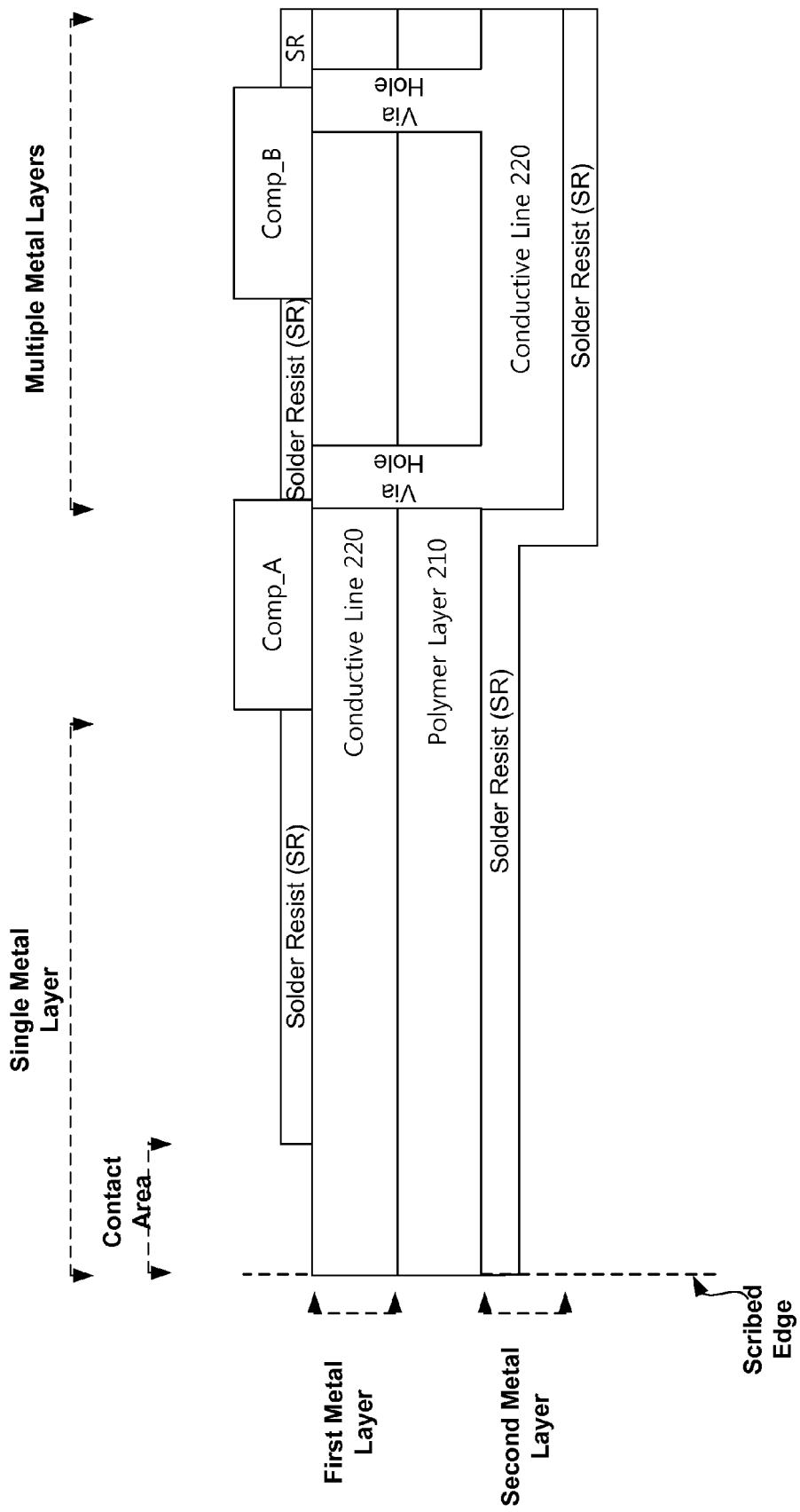

Accordingly, in some embodiments, the printed circuit board 200 may be provided with multiple metal layers. Referring to FIG. 13A, at least some part of the printed circuit 200 is provided with multiple metal layers. In particular, the part of the printed circuit board 200 between the contact area and the COMP_A 230 may be provided with a single metal layer (e.g., the first metal layer M1), whereas the part between the COMP_A 230 other components on the printed circuit board 200 is provided with a metal layer on both sides of a polymer layer 210. In this part of the printed circuit board 200, a first metal layer M1 is provided on one side of a polymer layer 210 and another metal layer M2 is provided on the opposite side of the polymer layer 210.

Accordingly, connection between some of the components in the part of the printed circuit board 200 with multiple metal layers may be made using the conductive lines 220 in both the first and second metal layers (M1, M2). With multiple metal layers in this part of the printed circuit board 200, some of the conductive line patterns in one metal layer can be arranged to cross over another conductive line patterns in another metal layer.

In the example shown in FIG. 13A, at least one of the conductive lines 220 formed of the first metal layer M1 is in contact with at least one conductive lines 220 formed of the second metal layer M2. As shown, the contacts between the first metal layer M1 and the second metal layer M2 can be made by a vertical conductive path (e.g., via hole) through the polymer layer 210. The via hole through the printed circuit board 200 may be formed by using a laser or a mechanical machining techniques. The via hole through the polymer layer 210 may be plated or filled with conductive material. Materials that may be used in providing the conductive path between the first and second metal layers include copper, silver, gold, copper-tungsten, other suitable metals, carbon-based or organic conductors, or a combination of these materials. The use of a via hole discussed above is merely illustrative, and various other methods or structures may be used to electrically connect the first metal layer M1 and the second metal layer M2.

FIG. 13B illustrates another example of printed circuit board 200 provided with multiple metal layers. The printed circuit board 200 can be susceptible to electrostatics, and the conductive lines 220 may be damaged by the electrostatics. Accordingly, the conductive line 220 formed with the second metal layer M2 may be a ground line, which is configured to discharge electrostatics from the printed circuit board 200. Rather than providing a conductive line, a metal plate can be provided in the second metal layer to discharge electrostatic from the printed circuit board 200. Providing a ground line or a ground metal plate can be particularly useful if the width of the conductive lines 220 on the printed circuit board are very narrow and/or if they are routed with a very narrow pitch.

Similar to the test pads 120_P and the test lines 120_C described in reference to FIGS. 7A-7B, the part of the conductive lines 220 on the printed circuit board 200 routed beyond the FOP area can be removed from the printed circuit board 200 when scribing/chamfering the printed circuit board 200 into a desired shape and size. Thus, the conductive lines 220 remaining on the printed circuit board 200 can be routed until the scribed/chamfered edges of the printed circuit board 200. For reliable connection between the connection interfaces, scribing of the printed circuit board 200 is usually performed with a certain margin between the scribed edge and the contact area where the part of the conductive lines 220 serve as the connectors. The part of the conductive lines 220 routed outside the contact area toward the scribed edge, which is sometimes referred to as the "valley" or the "valley pattern", is also susceptible to corrosion from the moisture and gasses passing through the micro-coating layer 132.

Accordingly, in some embodiments of the flexible display 100, at least some of the conductive lines 220 of the printed circuit board 200 may be configured as the bridged conductive lines 120 discussed above. Referring to FIG. 13C, two separate portions of a conductive line 220 in the first metal layer M1 is connected to each other by a bridge 220_B in the second metal layer M2. In particular, the exposed valley pattern of the conductive line 220 at the edge of the printed circuit board 200 is provided in the first metal layer M1. Also, the contact area to be connected to the connection interface on the base layer 106 and other parts of the conductive line 220 connected to the pins of the COMP_A 230 and/or to the pins of other components (e.g., power supply unit 240) are separated from the valley of the conductive line 220. Electrical connection between the valley pattern of the conductive line 220 and other separated conductive line parts is made through the bridge 220_B provided in the second metal layer M2. As discussed above, the contact between the first metal layer M1 and the second metal layer M2 can be made through the via hole, which may be plated or filled with conductive material.

In this configuration, the bridge 220B allows to perform various electrical inspection on the conductive lines 220, and also protects the contact area and other parts of the conductive line 220 from the corrosion which may occur at the valley pattern after scribing/chamfering the printed circuit board 200.

Referring to FIG. 13D, some part of a conductive line 220 can be provided in the first metal layer M1 while some other part of the conductive line 220 is provided in the second metal layer M2. The contact area may be arranged to expose a part of the conductive line 220 provided in the first metal layer M1 and a part of the conductive line 220 in the second metal layer M2 may be exposed to provide test pads for inspection of the printed circuit board 200. The conductive lines in the first metal layer M1 and the second metal layer M2 are connected through a via hole. The conductive line 220 in the first metal layer M1 may be formed such that it is not extended to the scribed edge of the printed circuit board 200. Also, the conductive line 220 in the first metal layer M1 may be covered by a layer of an insulating material (e.g., the solder resist: SR) to protect the conductive line 220 from the corrosion. Growth of corrosion from the valley pattern of the conductive line 220 in the second metal layer 220 can be suppressed by the bridged structure as depicted in FIG. 13D.

Figure 14A:
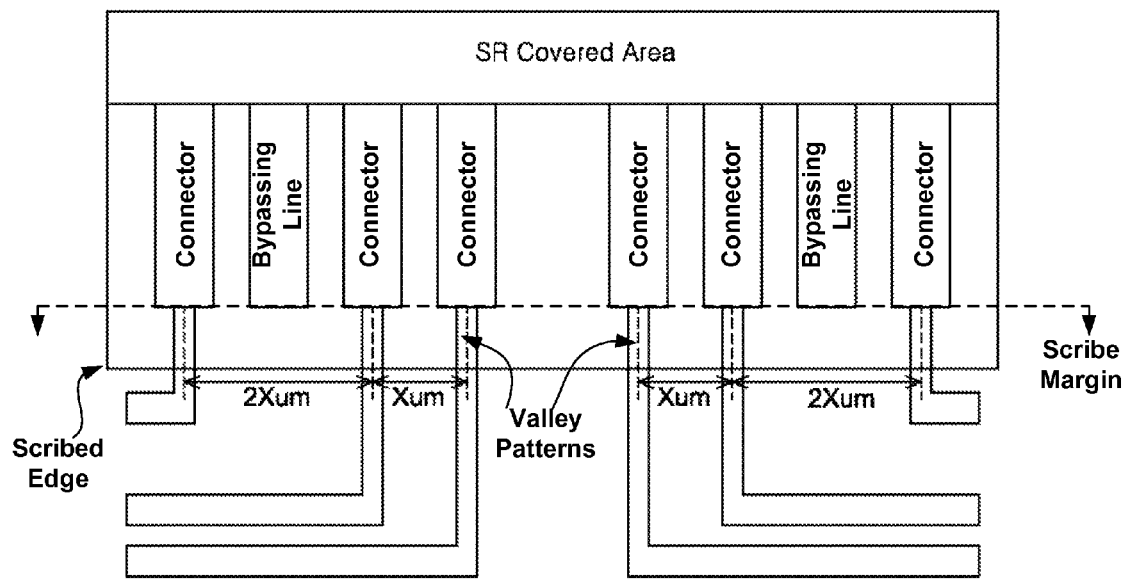
FIGS. 14A-14D are plan views illustrating exemplary configurations of the connectors on the first printed circuit in the FOP area.

The printed circuit board 200 of the flexible display 100 may employ yet another feature that can help minimize corrosion of the conductive lines 220. FIG. 14A is a plan view illustrating an exemplary configuration of the conductive lines 220 in the FOP area on the printed circuit 200. As shown, certain conductive lines 220 disposed on the printed circuit board 200 are arranged not to extend beyond the contact areas. That is, on the printed circuit board 200, some connectors are provided with valley patterns while some of the selected connectors are provided without the valley patterns.

In case where there is another external component or other printed circuit board to be connected to the printed circuit board 200, the conductive lines 220 that are routed between the FOP area and the FOF area without being connected to the components on the printed circuit board 200, such as the Drive-IC 230, may be the conductive lines 220 that end at the contact area without the valley pattern. Such conductive lines (denoted "bypassing line" in FIG. 14A) are routed on the printed circuit board 200 simply to provide interconnections between the components on the base layer 106 and the components on another printed circuit board, and thus, chances of defects in such conductive lines 220 are very slim.

Without the valley pattern, the end of the conductive line 220 is not cut by the scribing process, and the outer layer (e.g., Sn layer) of the conductive line 220 can cover the inner layer (e.g., Cu layer) of the conductive line 220, which in turn suppresses corrosion. Also, eliminating the valley pattern of such bypassing conductive lines 220 can increase the distance X between the valley patterns of other conductive lines 220. Electrical flow between anodic metal and cathode metal being one of the essential element for corrosion, increase in the distance between the valley patterns can help reduce corrosion on those valley patterns. In addition, increasing the distance X between the valley patterns can lower the chances of short between the conductive lines 220 caused by the corrosion debris and other deposits.

Figure 14B:
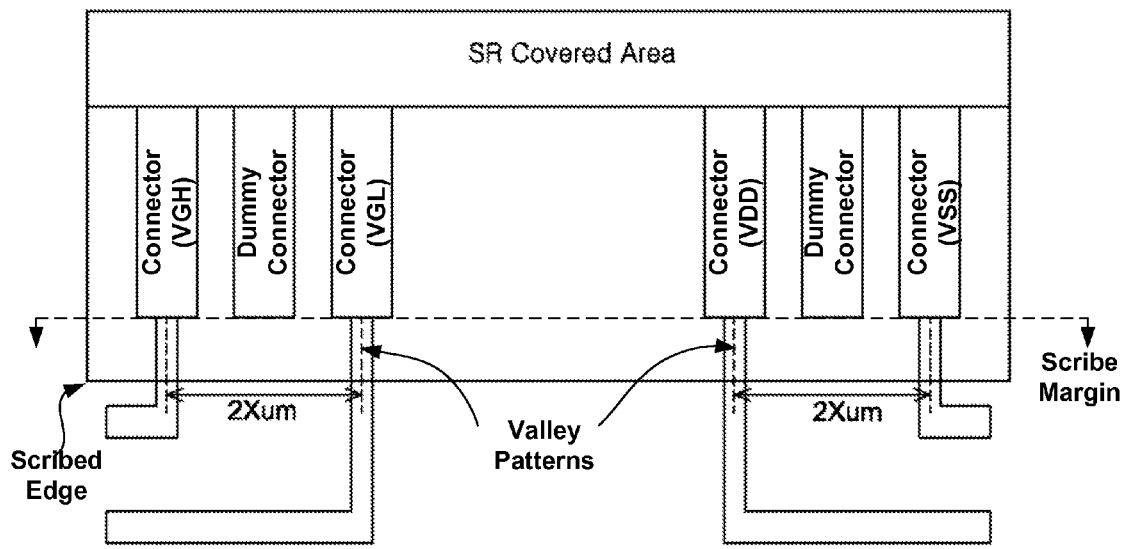

In some embodiments, a dummy connector may be provided between the connectors that transmit signals of a voltage large difference from each other. Referring to FIG. 14B, a dummy connector can be positioned between a connector for transmitting VGH and a connector for transmitting VGL. Also, a dummy connector can be positioned between the VSS line connector and the VDD line connector. The VGH/VGL and VDD/VSS line connectors have the valley pattern extending to the scribed edge of the printed circuit board 200, whereas the dummy connectors do not have the valley patterns. The space between the connectors of the oppositely charged conductive lines 200 is increased by the width of the dummy connector. The end of the dummy connector is spaced apart from the scribed edge of the printed circuit board 200. As such, corrosion control on the valley patterns of the conductive lines with large voltage difference can be realized.

In some cases, some of the signals, for instance the gate high/low signals and/or the power signals, may be transmitted by using a group of several conductive lines 220 positioned next to each other on the printed circuit board 200. Also, conductive lines 220 transmitting similar signals (e.g., clock signals) may be arranged next to each other on the printed circuit board 200. In such cases, inspection on all of the conductive lines 220 of the same group may not be necessary. Accordingly, in some embodiments, at least one or more of connectors in a group of adjacently positioned connectors transmitting the same or similar type of signals may be provided on the printed circuit board 200 without the valley pattern.

Figure 14C:
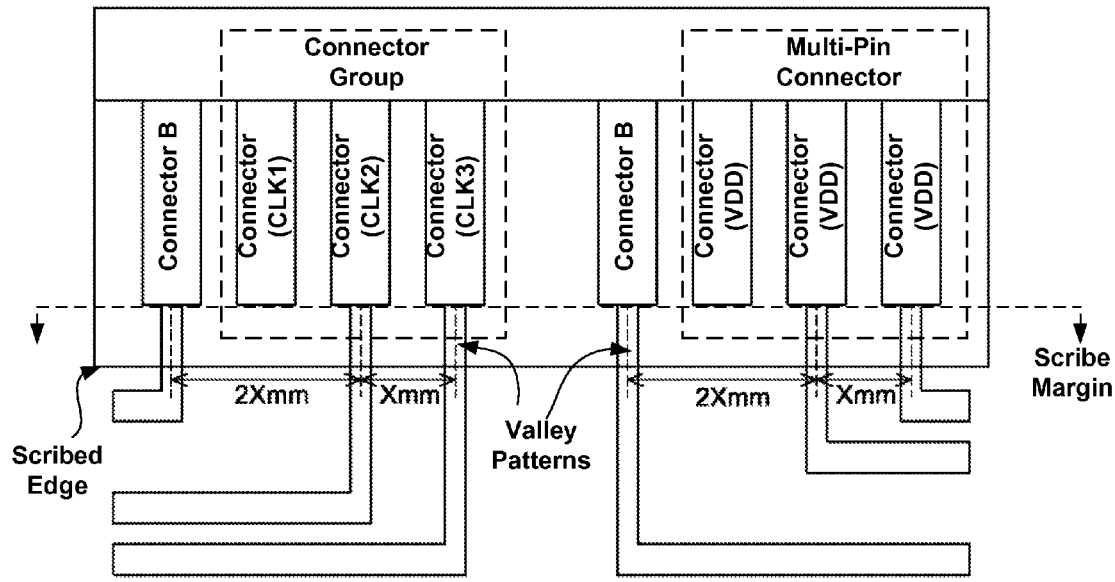

Referring to FIG. 14C, connectors for transmitting similar type of signals are provided adjacent to each other, which are denoted as "Connector Group." Also, adjacently positioned connectors for transmitting the same signal are denoted as "Multi-Pin Connector." As shown, at least one of the connectors among the multi-pin connector may be formed on the printed circuit board 200 without the valley pattern. Similarly, at least one of the connectors among the group of connectors that provides similar signals may not be provided with the valley pattern. For instance, any one of the conductive lines CLK1, CLK2 and CLK3 may end with a connector without the valley pattern. This way, distance X between the remaining valleys can be increased, which can help reduce corrosion on those valley patterns. Further, chances of short between the valley patterns by the corrosion debris and other deposits can be reduced by increasing the distance X between the valley patterns.

In some embodiments, the connector without the valley pattern may be the first and/or the last connector among the group of connectors. In FIG. 14C, the connector B, which is positioned next to the connector group or the multi-pin connectors, may be configured to transmit a different type of signal from the signals transmitted on the connector group and the multi-pin connectors. By way of example, the connectors in the connector group may be configured to transmit clock signals and the connector B may be configured to transmit any one of the VGH, VGL, VDD and VSS signals. Among the connectors included in connector group and the multi-pin connectors, one that is positioned immediately adjacent to the connector B may be provided on the printed circuit board 200 without the valley pattern.

Figure 14D:
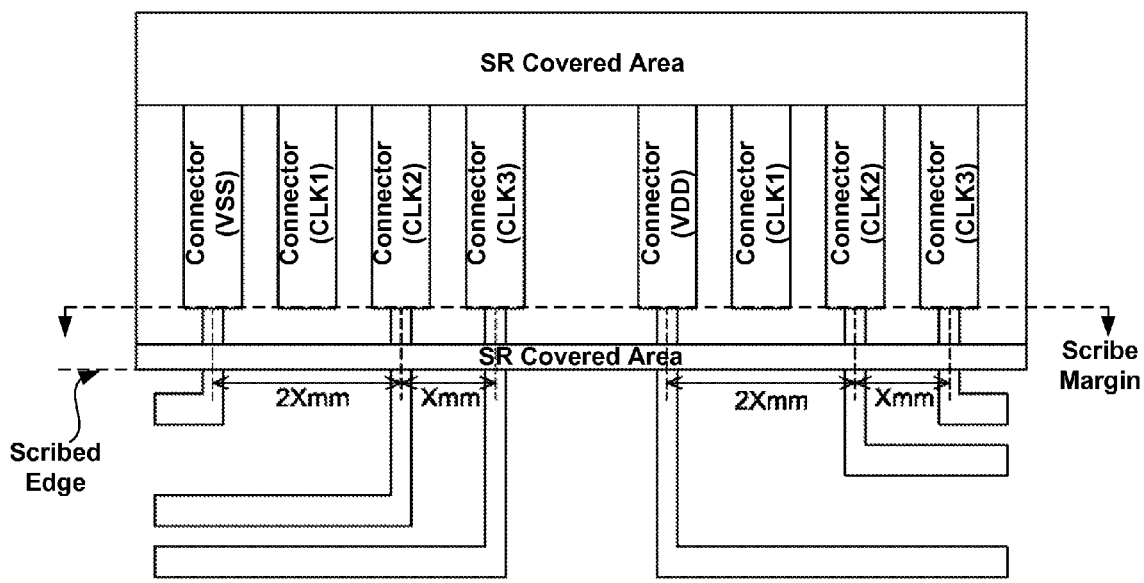

Furthermore, in some embodiments, solder resist (SR) covering the conductive lines outside the contact area may also be provided over the valley patterns along the scribed edge as depicted in FIG. 14D. In this regard, the solder resist (SR) may be coated over the valley patterns prior to scribing the printed circuit board 200. Alternatively, the solder resist (SR) may be coated over the valley patterns after the scribing of the printed circuit board 200 is performed. In the latter case, the solder resist (SR) may cover the exposed cross-sectional side surface of the valley pattern. While the configurations of connectors are described in reference to the connectors in FOP area, such configurations can also be used for the connectors in the FOF area.

These various aspects, embodiments, implementations or features of the described embodiments can be used separately or in any combination. The foregoing is merely illustrative of the principles of this invention and various modifications can be made by those skilled in the art without departing from the scope of the invention.

What is claimed is:
1. A flexible display apparatus, comprising:
a flexible base layer defined with a first area, a second area and a bend allowance section between the first area and the second area of the flexible base layer;
a plurality of display pixels in the first area of the flexible base layer; and
at least one driver integrated circuit (D-IC) placed in the second area of the flexible base layer,
wherein the first area and the second area are substantially flat, and an entirety of the bend allowance section is bent.

2. The flexible display apparatus of claim 1, further comprising a gate driver circuitry in the first area.

3. The flexible display apparatus of claim 1, wherein the D-IC placed in the second area of the flexible base layer includes a display driver integrated circuit.

4. The flexible display apparatus of claim 1, wherein the D-IC placed in the second area of the flexible base layer includes a touch sensor driver integrated circuit.

5. The flexible display apparatus of claim 1, further comprising a plurality of conductive lines in the bend allowance section of the flexible base layer, the plurality of conductive lines in the bend allowance section being routed from the D-IC in the second area to one or more conductive lines placed in the first area of the flexible base layer.

6. The flexible display apparatus of claim 1, further comprising a printed circuit board coupled to a connection interface provided in the second area of the flexible base layer, wherein a polymer layer of the flexible printed circuit board is different from the base layer.

7. The flexible display apparatus of claim 1, further comprising a power supply unit placed on the printed circuit board.

8. The flexible display apparatus of claim 1, wherein the first area and the second area have a less curvature than that of the bend allowance section.

9. The flexible display apparatus of claim 1, wherein the bend allowance section of the flexible base layer is bent such that the second area of the flexible base layer is arranged to overlap at least some part of the first area of the flexible base layer.

10. The flexible display apparatus of claim 1, wherein the first area of the flexible base layer is provided in a rounded shape.

11. The flexible display apparatus of claim 1, wherein a notch is provided in the bend allowance section of the flexible base layer.

12. The flexible display apparatus of claim 1, wherein a width of flexible base layer in the bend allowance section is shorter than width of the flexible base layer in the first area and the second area.

13. The flexible display apparatus of claim 1, wherein the bend allowance section of the flexible base layer is thinner than the first and second areas of the flexible base layer.

14. The flexible display apparatus of claim 1, wherein the plurality of display pixels in the first area is disposed on a first side of the flexible base layer and the D-IC in the second area is disposed on a second side of the flexible base layer.

15. The flexible display apparatus of claim 1, wherein at least one of the conductive lines in the bend allowance section includes a chain of links, in which each of the links has a segment that is arranged non-parallel to the tangent vector of a curvature of the flexible base layer in the bend allowance section.

16. The flexible display apparatus of claim 1, wherein at least one of the conductive lines in the bend allowance section includes a grid of links, in which each of the links has a segment that is arranged non-parallel to the tangent vector of a curvature of the flexible base layer in the bend allowance section.

17. The flexible display apparatus of claim 1, further comprising one or more insulation layers that are patterned according to a trace design of the plurality of conductive lines.

18. The flexible display apparatus of claim 1, further comprising a support layer having a rounded edge portion, wherein the support layer is arranged on the second side of the flexible base layer such that the bend allowance section of the flexible base layer wraps around the rounded edge portion of the support layer.

19. The flexible display apparatus of claim 1, further comprising a first support layer and a second support layer on the first side of the flexible base layer, the first support layer being provided in the first area and the second support layer being provided in the second area of the flexible base layer.

20. The flexible display apparatus of claim 19, further comprising a support member having an elongated body portion and a rounded end portion, wherein the support member is arranged such that the bend allowance section of the flexible base layer wraps around the rounded end portion of the support member.

* * * * *